(12) United States Patent
Daycock et al.

(10) Patent No.: US 11,744,086 B2
(45) Date of Patent: Aug. 29, 2023

(54) METHODS OF FORMING ELECTRONIC DEVICES, AND RELATED ELECTRONIC DEVICES

(71) Applicant: Micron Technology, Inc., Boise, ID (US)

(72) Inventors: David A. Daycock, Singapore (SG); Jonghun Kim, Singapore (SG)

(73) Assignee: Micron Technology, Inc., Boise, ID (US)

( * ) Notice: Subject to any disclaimer, the term of this patent is extended or adjusted under 35 U.S.C. 154(b) by 151 days.

(21) Appl. No.: 17/171,622

(22) Filed: Feb. 9, 2021

(65) Prior Publication Data

US 2022/0254834 A1 Aug. 11, 2022

(51) Int. Cl.
*H10B 63/00* (2023.01)
*H10N 70/00* (2023.01)

(52) U.S. Cl.
CPC ........... *H10B 63/84* (2023.02); *H10N 70/023* (2023.02); *H10N 70/026* (2023.02); *H10N 70/8265* (2023.02); *H10N 70/881* (2023.02)

(58) Field of Classification Search
CPC ... H01L 27/2481; H01L 45/124; H01L 45/14; H01L 45/1616; H01L 45/1625; H01L 27/11524; H01L 27/11548; H01L 27/11556; H01L 27/1157; H01L 27/11575; H01L 27/11582; H10B 63/84; H10B 61/00; H10B 41/35; H10B 41/27; H10B 41/50; H10B 43/27; H10B 43/35; H10B 43/50; H10N 70/023; H10N 70/026; H10N 70/8265; H10N 70/881
See application file for complete search history.

(56) References Cited

U.S. PATENT DOCUMENTS

| | | | |
|---|---|---|---|
| 8,743,589 B2 | 6/2014 | Sandhu et al. | |
| 8,916,922 B2 * | 12/2014 | Jang | H01L 29/66833 257/411 |
| 9,318,430 B2 | 4/2016 | Tang et al. | |
| 2013/0154055 A1 | 6/2013 | Oh et al. | |
| 2013/0273700 A1 | 10/2013 | Rabkin et al. | |
| 2013/0334589 A1 | 12/2013 | Ahn | |
| 2019/0115362 A1 | 4/2019 | Choi | |
| 2020/0251486 A1 | 8/2020 | Tsutsumi et al. | |
| 2020/0328222 A1 | 10/2020 | Barclay et al. | |

* cited by examiner

*Primary Examiner* — Allison Bernstein
(74) *Attorney, Agent, or Firm* — TraskBritt

(57) ABSTRACT

A method of forming an electronic device comprises forming a stack structure comprising vertically alternating insulative structures and additional insulative structures, and forming pillars comprising a channel material and at least one dielectric material vertically extending through the stack structure. The method comprises removing the additional insulative structures to form cell openings, forming a first conductive material within a portion of the cell openings, and forming a fill material adjacent to the first conductive material and within the cell openings. The fill material comprises sacrificial portions. The method comprises removing the sacrificial portions of the fill material, and forming a second conductive material within the cell openings in locations previously occupied by the sacrificial portions of the fill material. Related electronic devices, memory devices, and systems are also described.

25 Claims, 13 Drawing Sheets

METHODS OF FORMING ELECTRONIC DEVICES, AND RELATED ELECTRONIC DEVICES

TECHNICAL FIELD

Embodiments disclosed herein relate to the field of microelectronic device design and fabrication. More particularly, embodiments of the disclosure relate to methods of forming electronic devices including a fill material (e.g., a non-conductive material, a differing conductive material) within a central portion of individual conductive structures (e.g., access lines, word lines), and to related electronic devices, memory devices, and systems.

BACKGROUND

A continuing goal of the electronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more stack structures including tiers of conductive structures and insulative structures. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the conductive stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the conductive stack structure(s) of the memory device. The staircase structure includes individual "steps" defining contact regions of the conductive structures, upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the number of tiers of the conductive structures increases, processing conditions for the formation of the vertical memory strings extending through the stack become increasingly difficult. In addition, as the thickness of each tier decreases to increase the number of tiers within a given height of the stack, the resistivity of the conductive structures may increase and the conductivity may exhibit a corresponding decrease. However, a reduction in the conductivity of the conductive structures may impact performance of the stings of memory cells.

DETAILED DESCRIPTION

Figure 1A:
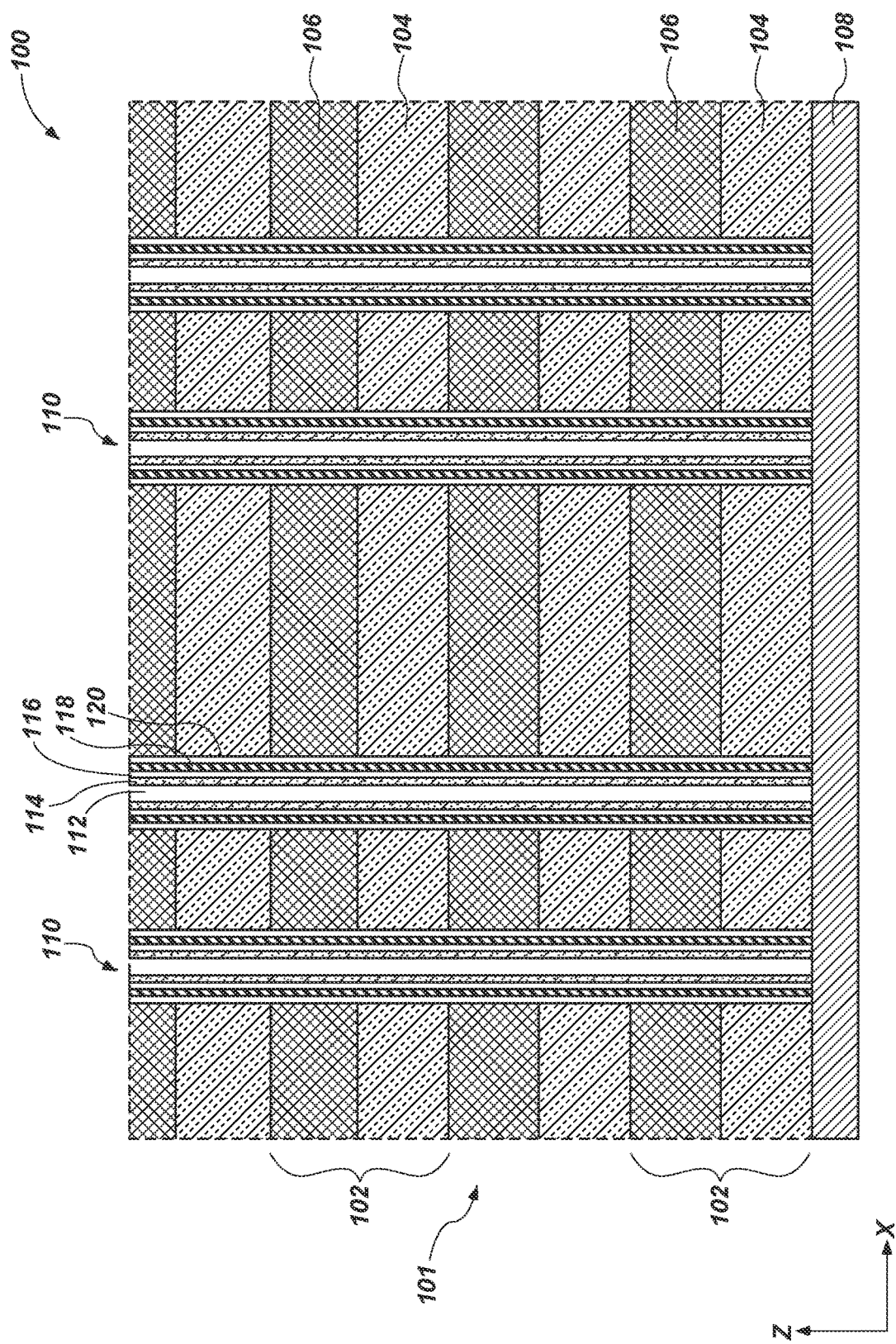
FIG. 1A through FIG. 1K are simplified cross-sectional (FIGS. 1A-1H and 1J-1K) and simplified partial top-down (FIG. 1I) views illustrating a method of forming an electronic device, in accordance with embodiments of the disclosure.

Methods of forming an electronic device (e.g., a microelectronic device, a semiconductor device, a memory device) including a fill material (e.g., a non-conductive material, a differing conductive material) within a central portion of individual conductive structures (e.g., access lines, word lines) are described herein, as are related electronic devices, memory devices, and systems. In some embodiments, a method of forming an electronic device comprises forming a stack structure comprising vertically alternating insulative structures and additional insulative structures, forming pillars vertically extending through the stack structure, and removing the additional insulative structures to form cell openings. A first conductive material (e.g., a metal) may be formed within a portion of the cell openings and a fill material may be formed adjacent to the first conductive material and within the cell openings. The fill material may have a material composition that differs from a material composition of the first conductive material and may be selectively etchable relative to the first conductive material. For example, the fill material may include one or more of a non-conductive material (e.g., an oxide material, a nitride material, or a carbide material), a semiconductor material (e.g., polysilicon), or a conductive material (e.g., titanium nitride, a metal) having a material composition that differs from a material composition of the first conductive material. Sacrificial portions of the fill material may be removed, and a second conductive material may be formed within the cell openings in locations previously occupied by the sacrificial portions of the fill material. Therefore, the conductive structures (e.g., conductive lines, access lines, word lines) include the fill material within a central portion (e.g., a vertically central portion) of individual conductive structures of the stack structure.

The fill material in the central portion is located between neighboring pillars and is substantially surrounded by the conductive material within the individual conductive structures. The second conductive material may be formed within the cell openings proximate to slots (e.g., replacement gate slots) without the second conductive material being formed between the neighboring pillars. Further, conductive rails may optionally be formed directly laterally adjacent to exposed surfaces of the first conductive material and the second conductive material. By using two or more (e.g., three) separate process acts, the fill material may be formed within the central portion of the conductive structures, effectively reducing voids in the conductive tiers of the tiers. Further, presence of the fill material reduces parasitic capacitance between adjacent conductive structures and increases shorts margin between vertically neighboring conductive structures without significantly affecting resistance. By decreasing the parasitic capacitance, the electronic device containing the fill material in the central portion of the conductive structures according to embodiments of the disclosure may utilize less power and operate at higher speeds compared to conventional electronic devices.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional electronic device fabrication techniques employed in the industry. In addition, the description provided below does not form a complete process flow for manufacturing an electronic device (e.g., a memory device, such as 3D NAND Flash memory device). The structures described below do not form a complete electronic device. Only those process acts and structures necessary to understand the embodiments of the disclosure are described in detail below. Additional acts to form a complete electronic device from the structures may be performed by conventional fabrication techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "pitch" refers to a distance between identical points in two adjacent (i.e., neighboring) features.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), an electronic device combining logic and memory, or a graphics processing unit (GPU) incorporating memory.

As used herein, the term "electronic device" includes, without limitation, a memory device, as well as a semiconductor device which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "conductive material" means and includes an electrically conductive material. The conductive material may include one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon.

As used herein, a "conductive structure" means and includes a structure formed of and including one or more conductive materials. Additional materials (e.g., non-conductive materials) may also be present within boundaries (e.g., within a central portion) of the conductive structure.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

As used herein, an "insulative structure" means and includes a structure formed of and including an insulative material.

As used herein, the term "high-k dielectric material" means and includes a dielectric oxide material having a dielectric constant greater than the dielectric constant of silicon oxide ($SiO_x$), such as silicon dioxide ($SiO_2$). The high-k dielectric material may include a high-k oxide material, a high-k metal oxide material, or a combination thereof. By way of example only, the high-k dielectric material may be aluminum oxide, gadolinium oxide, hafnium oxide, niobium oxide, tantalum oxide, titanium oxide, zirconium oxide, hafnium silicate, a combination thereof, or a combination of one or more of the listed high-k dielectric materials with silicon oxide.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "sacrificial," when used in reference to a material or structure, means and includes a material, structure, or a portion of a material or structure that is formed during a fabrication process but which is removed (e.g., substantially removed) prior to completion of the fabrication process.

As used herein, the phrase "coupled to" refers to structures operatively connected with each other, such as electrically connected through a direct ohmic connection or through an indirect connection (e.g., via another structure).

Figure 1B:
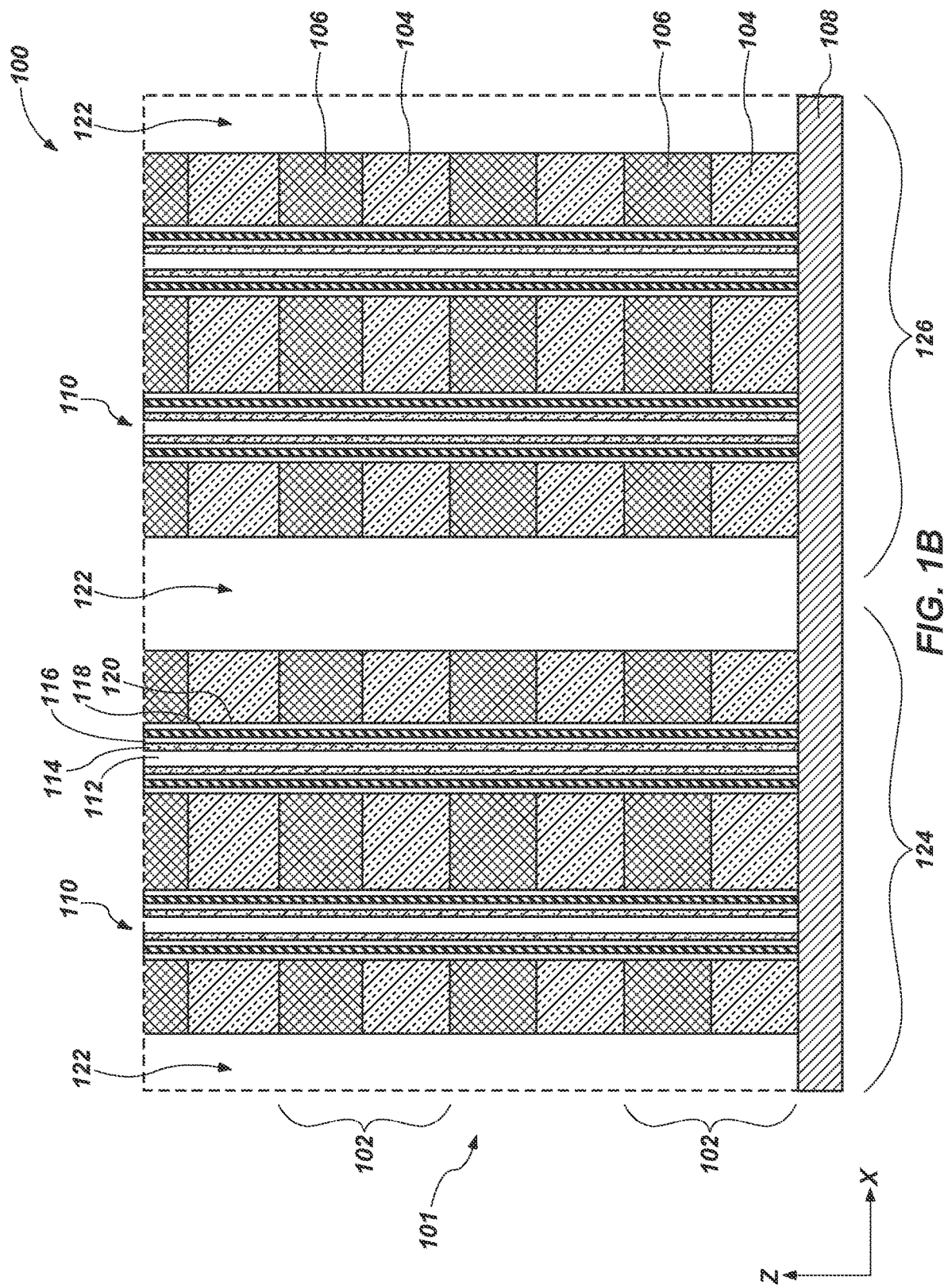
Figure 1C:
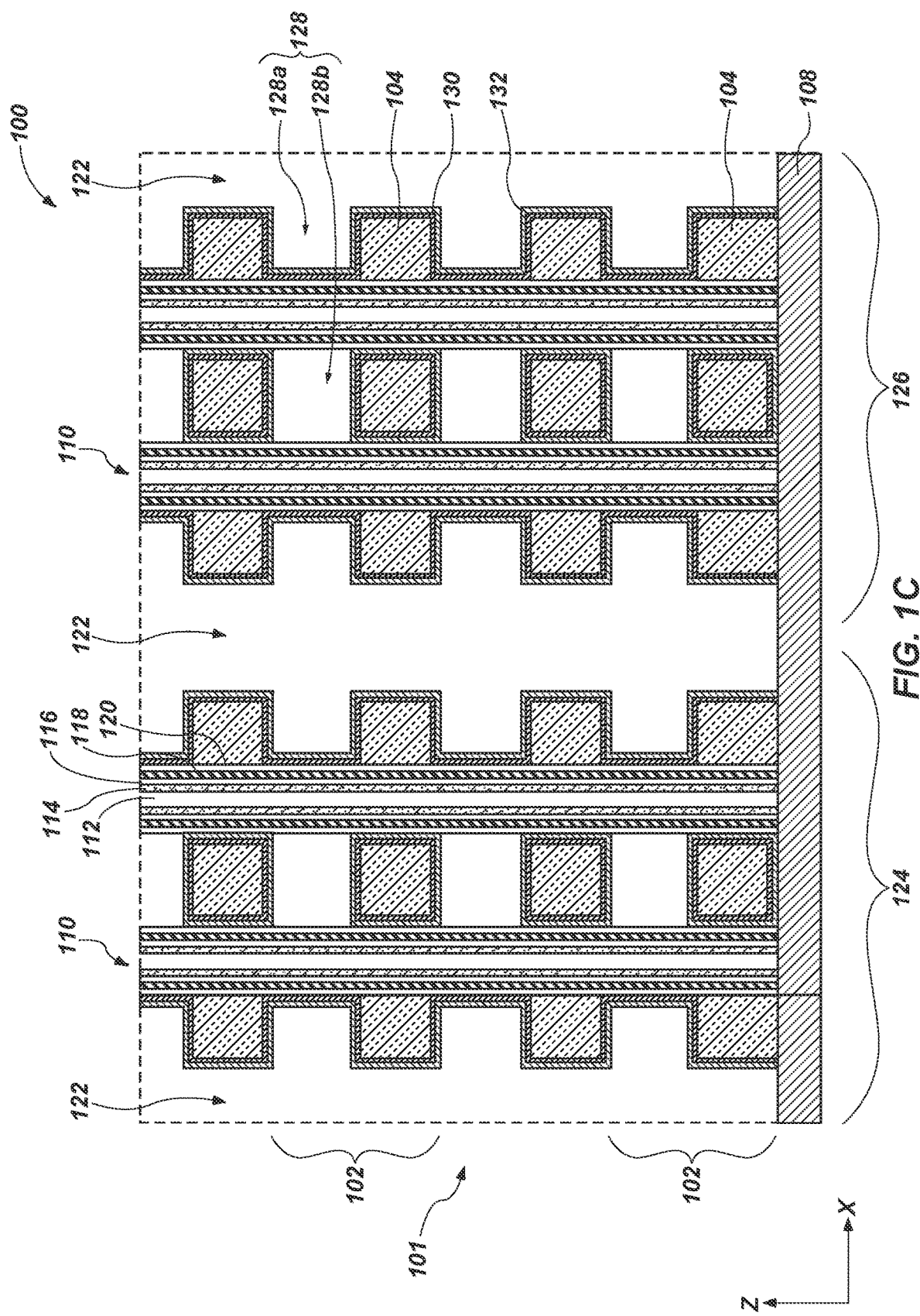
Figure 1D:
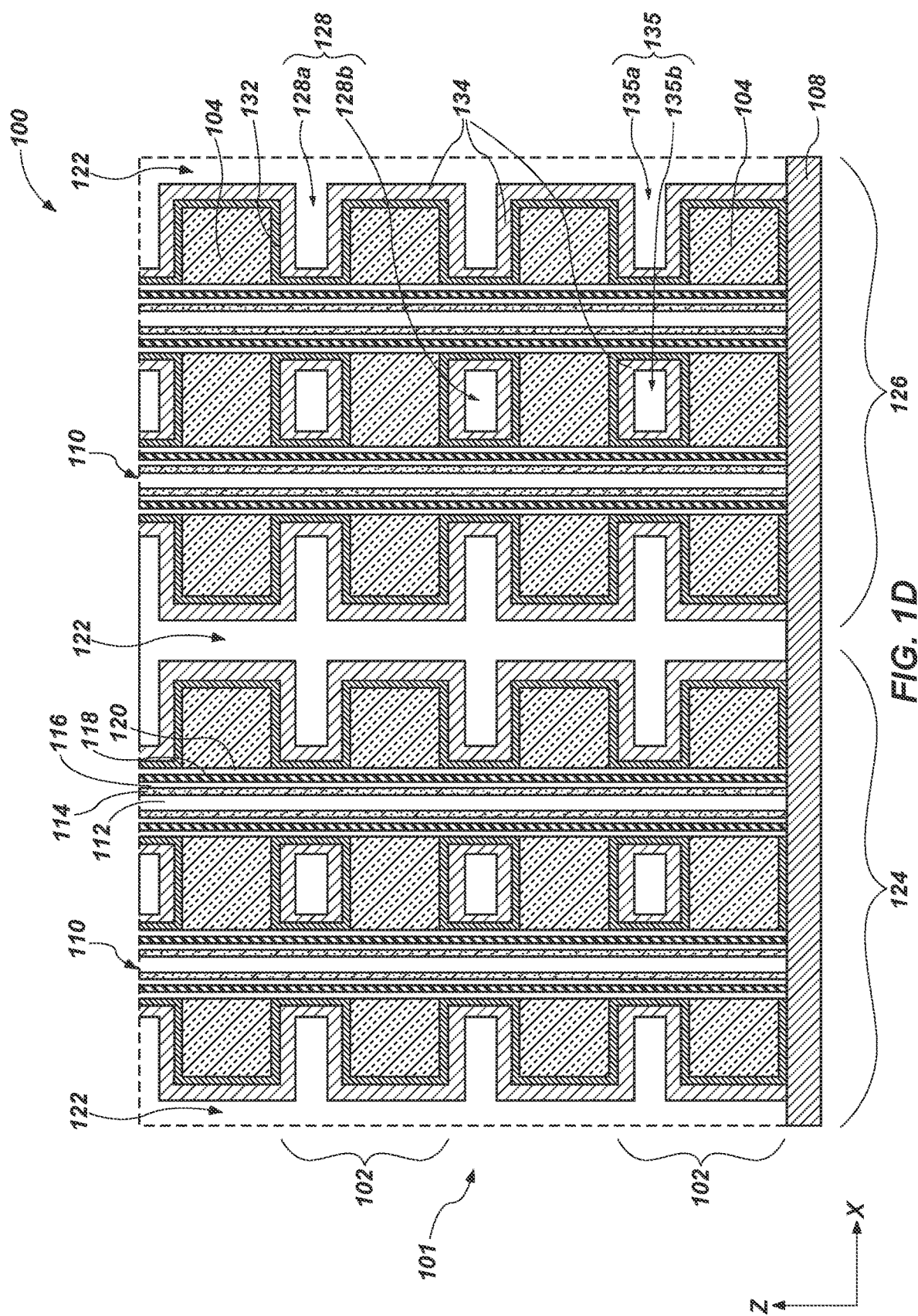
Figure 1E:
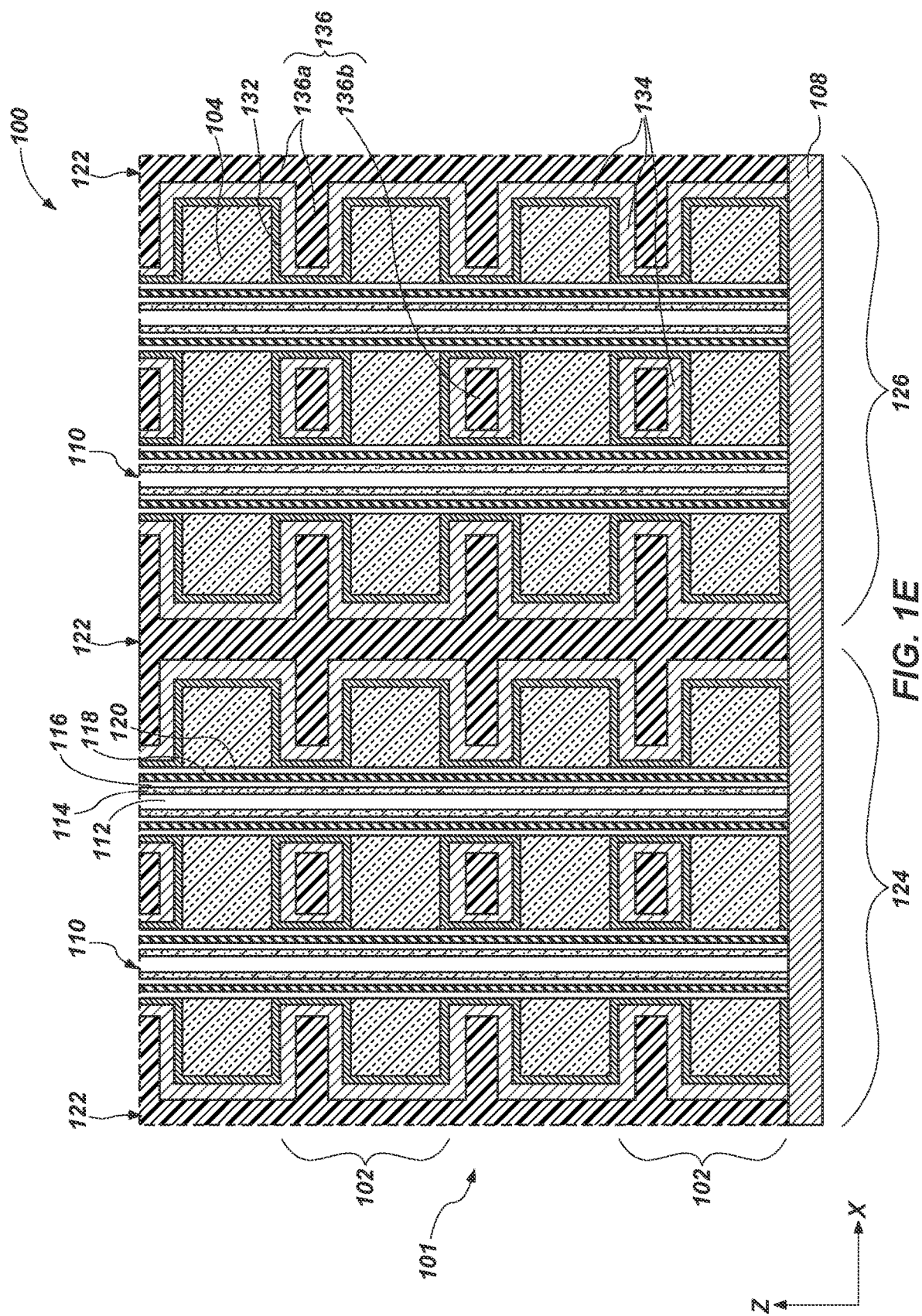
Figure 1F:
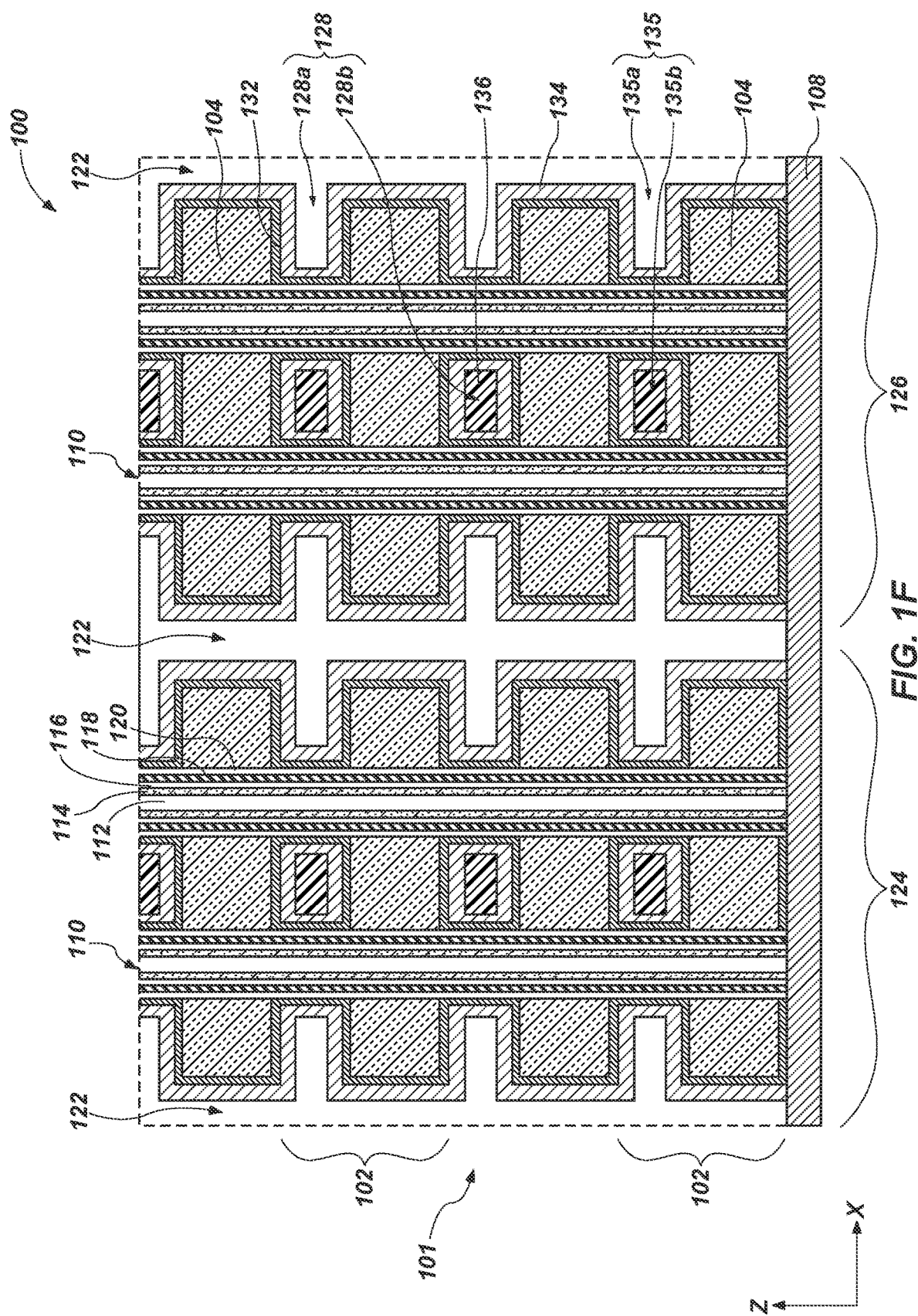
Figure 1G:
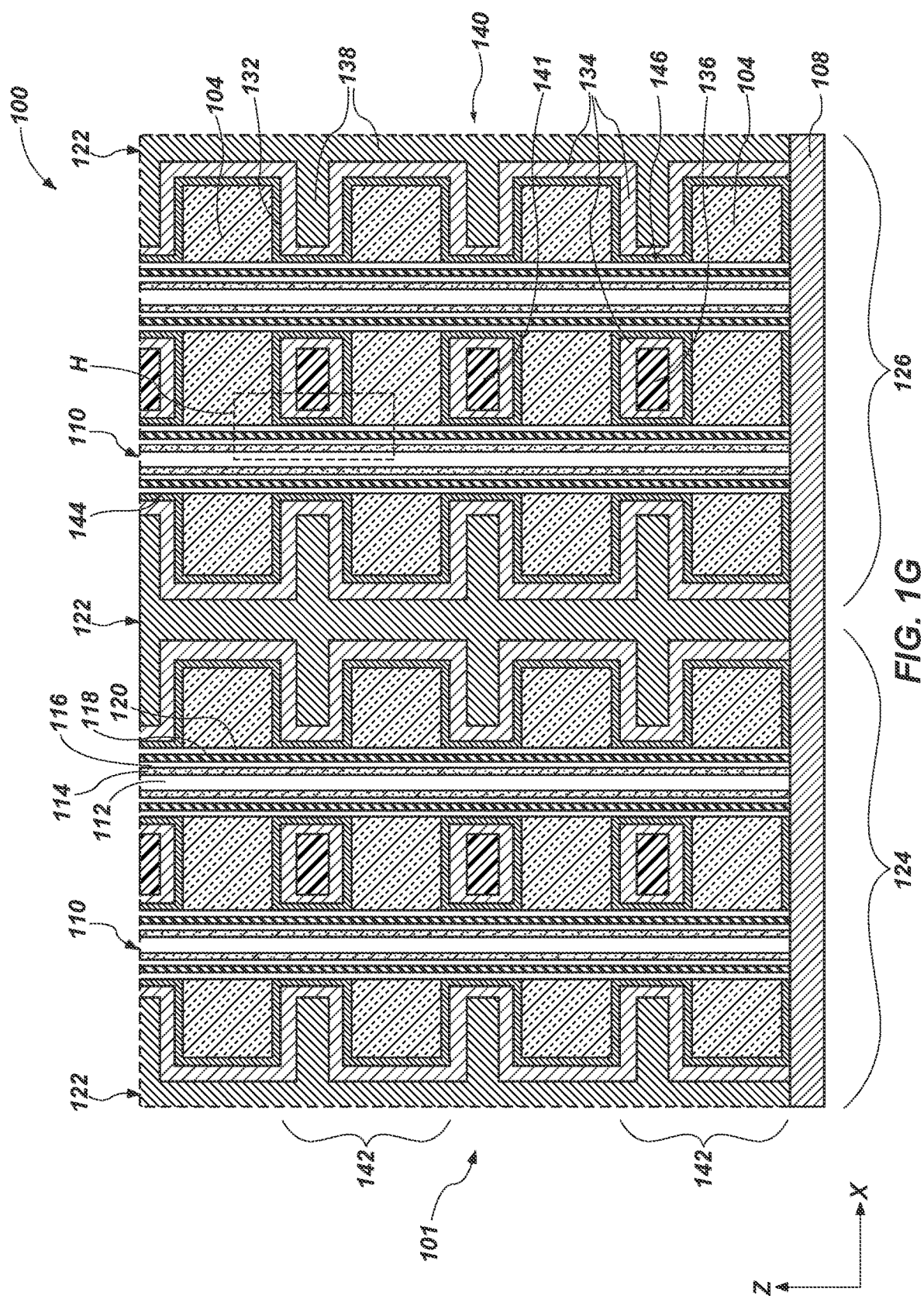
Figure 1H:
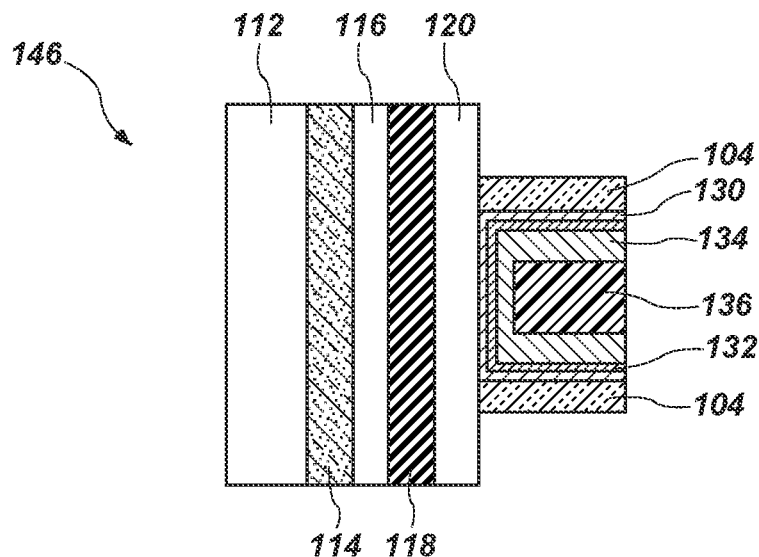
Figure 1I:
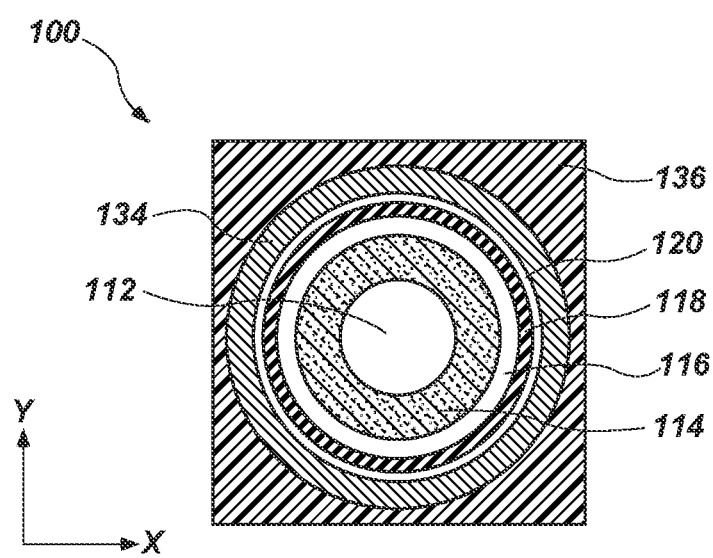

FIG. 1A through FIG. 1K illustrate a method of forming an electronic device (e.g., a memory device, such as a 3D NAND Flash memory device), in accordance with embodiments of the disclosure, of which FIG. 1H is an enlarged portion of FIG. 1G and FIG. 1I is a simplified partial top-down view of a portion of FIG. 1G. Referring to FIG. 1A an electronic device 100 may be formed to include a stack structure 101 including a vertically (e.g., in the Z-direction) alternating sequence of insulative structures 104 and additional insulative structures 106 arranged in tiers 102. Each of the tiers 102 may include at least one of the insulative structures 104 directly vertically adjacent at least one of the additional insulative structures 106.

A number (e.g., quantity) of tiers 102 of the stack structure 101 may be within a range from about 32 of the tiers 102 to about 256 of the tiers 102. In some embodiments, the stack structure 101 includes about 128 of the tiers 102. However, the disclosure is not so limited, and the stack structure 101 may include a different number of the tiers 102. The stack structure 101 may comprise at least one (e.g., one, two, more than two) deck structure vertically overlying a source structure 108. For example, the stack structure 101 may comprise a single deck structure or a dual deck structure (not shown) for a 3D memory device (e.g., a 3D NAND Flash memory device).

The insulative structures 104 may be formed of and include, for example, at least one dielectric material, such as at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$). In some embodiments, the insulative structures 104 are formed of and include $SiO_2$.

The additional insulative structures 106 may be formed of and include an insulative material that is different than, and exhibits an etch selectivity with respect to, the insulative structures 104. The additional insulative structures 106 may be formed of and include at least one dielectric nitride material (e.g., $SiN_y$) or at least one oxynitride material (e.g., $SiO_xN_y$). In some embodiments, the additional insulative structures 106 comprise $Si_3N_4$.

The stack structure 101 may be formed on or over the source structure 108 (e.g., a source plate). The source structure 108 may be formed of and include a conductive material such as, for example, a semiconductor material (e.g., polysilicon) doped with at least one P-type dopant (e.g., one or more of boron, aluminum, and gallium) or at least one N-type dopant (e.g., arsenic, phosphorous, antimony).

With continued reference to FIG. 1A, pillars 110 of materials may be formed to vertically extend (e.g., in the Z-direction) through the stack structure 101. The materials of the pillars 110 may be employed to form memory cells for a memory device following subsequent processing of the electronic device. The pillars 110 may each comprise an insulative material 112, a channel material 114 horizontally adjacent to the insulative material 112, a tunnel dielectric material (also referred to as a "tunneling dielectric material") 116 horizontally adjacent to the channel material 114, a memory material 118 horizontally adjacent to the tunnel dielectric material 116, and a dielectric blocking material (also referred to as a "charge blocking material") 120 horizontally adjacent to the memory material 118. The dielectric blocking material 120 may be horizontally adjacent to one of the levels of additional insulative structures 106 of one of the tiers 102 of the stack structure 101. The channel material 114 may be horizontally interposed between the insulative material 112 and the tunnel dielectric material 116, the tunnel dielectric material 116 may be horizontally interposed between the channel material 114 and the memory material 118, the memory material 118 may be horizontally interposed between the tunnel dielectric material 116 and the dielectric blocking material 120, and the dielectric blocking material 120 may be horizontally interposed between the memory material 118 and a level of the additional insulative structure 106.

The insulative material 112 may be formed of and include at least one insulative material. In some embodiments, the insulative material 112 is formed of and includes a dielectric oxide material, such as Sift. In additional embodiments, the insulative material 112 comprises an air gap.

The channel material 114 may be formed of and include one or more of at least one semiconductor material (at least one elemental semiconductor material, such as polycrystalline silicon, at least one III-V compound semiconductor material, at least one II-VI compound semiconductor material, at least one organic semiconductor material, GaAs, InP, GaP, GaN, other semiconductor materials), and at least one oxide semiconductor material. The channel material 114 may include amorphous silicon or polycrystalline silicon. The channel material 114 may include a doped semiconductor material.

The tunnel dielectric material 116 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 116 may be formed of and include one or more of a dielectric oxide material, a dielectric nitride material, and a dielectric oxynitride material. In some embodiments, the tunnel dielectric material 116 comprises Sift. In other embodiments, the tunnel dielectric material 116 comprises $SiO_xN_y$.

The memory material 118 may comprise a charge trapping material or a conductive material. By way of non-limiting example, the memory material 118 may be formed of and include one or more of silicon nitride, silicon oxynitride, polysilicon (doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), and a semiconductive material (e.g., a polycrystalline semiconductive material, an amorphous semiconductor material). In some embodiments, the memory material 118 comprises $Si_3N_4$.

The dielectric blocking material 120 may be formed of and include a dielectric material such as, for example, one or more of a dielectric oxide (e.g., $SiO_x$), a dielectric nitride (e.g., $SiN_y$), and a dielectric oxynitride (e.g., $SiO_xN_y$), or another dielectric material. In some embodiments, the dielectric blocking material 120 comprises $SiO_xN_y$.

The tunnel dielectric material 116, the memory material 118, and the dielectric blocking material 120 together may comprise a structure configured to trap a charge, such as, for example, an oxide-nitride-oxide (ONO) structure. In some such embodiments, the tunnel dielectric material 116 comprises Sift, the memory material 118 comprises $Si_3N_4$, and the dielectric blocking material 120 comprises Sift.

Referring to FIG. 1B, slots 122, which may also be referred to as "slits" or "replacement gate slots" may be formed through the stack structure 101. The slots 122 may be formed to vertically extend completely through the stack structure 101 and expose surfaces of the source structure 108. The slots 122 may be formed by, for example, exposing the electronic device 100 to one or more etchants to remove portions of the insulative structures 104 and the additional insulative structures 106 of the stack structure 101. The slots 122 may divide the electronic device 100 into separate blocks, such as a first block 124 and a second block 126. As shown in FIG. 1B, the first block 124 and the second block 126 may each include a plurality (e.g., multiple, more than one) of the pillars 110.

With reference to FIG. 1C, after forming the slots 122, the additional insulative structures 106 (FIG. 1B) of the stack structure 101 may be at least partially (e.g., substantially) removed through the slots 122 through a so-called "replacement gate" or "gate last" process. By way of non-limiting example, the additional insulative structures 106 may be at least partially removed by exposing the additional insulative structures 106 to at least one wet etchant comprising one or more of phosphoric acid, sulfuric acid, hydrochloric acid, nitric acid, or another etch chemistry. The additional insulative structures 106 may be at least partially removed by exposing the additional insulative structures 106 to a so-called "wet nitride strip" comprising phosphoric acid.

A dielectric barrier material 130 (e.g., a high-k dielectric material) may optionally be formed adjacent to (e.g., directly adjacent to) the dielectric blocking material 120 and adjacent to (e.g., directly adjacent to) the insulative structures 104 within cell openings 128, as illustrated in FIG. 1C. The dielectric barrier material 130 may be conformally formed by conventional techniques. The dielectric barrier material 130 comprises aluminum oxide. Alternatively, the dielectric barrier material 130 is formed from hafnium-doped silicon dioxide, where the ratio of hafnium to silicon is adjusted to achieve a desired etch selectivity of the dielectric barrier material 130. The dielectric barrier material 130 may be selected to exhibit high etch selectivity relative to the insulative material of the insulative structures 104 of the tiers 102.

A conductive liner material 132 may be formed adjacent to (e.g., directly adjacent to) the dielectric barrier material 130, if present, within the cell openings 128. The conductive liner material 132 may be formed of and include a seed material from which subsequently formed conductive materials of conductive tiers may be formed, as described in greater detail below. The conductive liner material 132 may be formed of and include, for example, a metal (e.g., titanium, tantalum), a metal nitride (e.g., tungsten nitride, titanium nitride, tantalum nitride), or another conductive material. In some embodiments, the conductive liner material 132 comprises titanium nitride. In other embodiments, the dielectric barrier material 130 is in direct contact with subsequently formed conductive structures (see FIG. 1C) and the insulative structures 104, and the electronic device 100 is substantially (e.g., entirely) devoid of the conductive liner material 132 between the dielectric barrier material 130 and the conductive structures. In other words, each of the tiers 102 may lack the conductive liner material 132 between the insulative structures 104 and the conductive structures. In additional embodiments, the dielectric barrier material 130 is absent from the cell openings 128 and the conductive liner material 132 is adjacent to (e.g., directly adjacent to) the insulative structures 104 and the conductive structures. For convenience, the dielectric barrier material 130 is absent in subsequent views of the drawings, although it is understood that the electronic device 100 may include one or both of the dielectric barrier material 130 and the conductive liner material 132.

As shown in FIG. 1C, end regions 128a of the cell openings 128 may be located proximate to the slots 122 and central regions 128b of the cell openings 128 may be located distal to the slots 122 (e.g., between horizontally neighboring pillars 110). Accordingly, portions of one or more of the dielectric barrier material 130 and the conductive liner material 132 may be located between the pillars 110 and the slots 122 and additional portions of the dielectric barrier material 130 and the conductive liner material 132 may be located between the horizontally neighboring pillars 110.

With reference to FIG. 1D, after removal of the additional insulative structures 106 (FIG. 1B) and following formation of one or more of the dielectric barrier material 130 (FIG. 1C) and the conductive liner material 132 within the cell openings 128, a first conductive material 134 may be formed between vertically neighboring insulative structures 104 at locations corresponding to the previous locations of the additional insulative structures 106. The first conductive material 134 may be formed of and include any conductive material including, but not limited to, n-doped polysilicon, p-doped polysilicon, undoped polysilicon, or a metal. In some embodiments, the first conductive material 134 is n-doped polysilicon. In other embodiments, the first conductive material 134 is tungsten. In additional embodiments, the first conductive material 134 is formed of and includes one or more of titanium, ruthenium, aluminum, and molybdenum.

The first conductive material 134 may be formed adjacent to (e.g., vertically adjacent to, horizontally adjacent to) one or more of the dielectric barrier material 130 and the conductive liner material 132 within the cell openings 128 and within portions of the slots 122. The first conductive material 134 may be formed using one or more conformal deposition techniques or growth techniques, such as one or more of a conventional ALD process, a conventional conformal CVD process, and a conventional in situ growth process. Since the first conductive material 134 is conformally formed, a portion of the cell openings 128 within the stack structure 101 may remain substantially free of the first conductive material 134. Accordingly, the first conductive material 134 is formed in the cell openings 128 without fully filling the cell openings 128 of the stack structure 101. The first conductive material 134 may be formed adjacent to (e.g., directly adjacent to) exposed surfaces (e.g., upper surfaces, lower surfaces, side surfaces) of the conductive liner material 132, if present. Alternatively, the first conductive material 134 may be formed adjacent to (e.g., directly adjacent to) exposed surfaces of the insulative structures 104.

Portions of the first conductive material 134 proximate to the slots 122 may be selectively removed, such as by etching, to recess the first conductive material 134 from surfaces defining the slots 122 within the cell openings 128 and to form recessed portions 135. In other words, portions of the first conductive material 134 located centrally within the cell openings 128 are recessed to form the recessed portions 135 and additional portions of the first conductive material 134 are present within a perimeter of the cell openings 128 (e.g., adjacent to the conductive liner material 132). Since the end regions 128a of the cell openings 128 are located proximate to the slots 122, end regions 135a of the recessed portions 135 of the first conductive material 134 are located proximate to the slots 122 corresponding to locations of the end regions 128a. In addition, since the central regions 128b of the cell openings 128 are located distal to the slots 122 and between the horizontally neighboring pillars 110, central regions 135b of the recessed portions 135 are located distal to the slots 122 and between the horizontally neighboring pillars 110 corresponding to locations of the central regions 128b. Accordingly, the end regions 128a of the cell openings 128 are defined by the first conductive material 134 on three sides in locations proximate to the slots 122, and the central regions 128b of the cell openings 128 are defined by the first conductive material 134 on four sides in locations distal to the slots 122 and between the horizontally neighboring pillars 110, as shown in FIG. 1D. In other words, the end regions 128a of the cell openings 128 are laterally bordered on one side by the pillars 110 and exposed to the slots 122 on an opposing side boundary, while the central regions 128b of the cell openings 128 are laterally bordered on both sides by the pillars 110.

With reference to FIG. 1E, a fill material 136 may be formed adjacent to (e.g., directly adjacent to) exposed surfaces of the first conductive material 134 within remaining portions (e.g., central portions) of the cell openings 128 (FIG. 1D) and within portions of the slots 122. The fill material 136 may substantially completely fill a remainder of the cell openings 128 including the recessed portions 135 (FIG. 1D) of the first conductive material 134 so as to substantially fully extend between exposed surfaces (e.g., upper surfaces, lower surfaces, side surfaces) of the first conductive material 134. The fill material 136 may, for example, be a non-conductive material, a semiconductor material, or a conductive material differing in composition from the first conductive material 134. Accordingly, end portions 136a of the fill material 136 are substantially surrounded by the first conductive material 134 on three sides in locations proximate to the slots 122, and central portions 136b of the fill material 136 are substantially surrounded by the first conductive material 134 on four sides in locations distal to the slots 122 and between the horizontally neighboring pillars 110, as shown in FIG. 1E. Portions of the fill material 136 proximate to the slots 122 (e.g., the end portions 136a) are sacrificial and are subsequently removed, as described in greater detail with reference to FIG. 1F. The fill material 136 may have a material composition that differs from a material composition of the first conductive material 134 and may be selectively etchable relative to the first conductive material 134.

The fill material 136 may be formed using one or more conformal deposition processes, such as one or more of a conventional conformal CVD process or a conventional ALD process. By conformally forming the fill material 136, voids in the tiers 102 may be substantially reduced (e.g., minimized) during formation of the conductive materials of the stack structure 101. Alternatively, the fill material 136 may be formed using one or more conventional non-conformal deposition processes, such as one or more of a conventional PVD process (e.g., a conventional radio frequency PVD (RFPVD) process), or a conventional non-conformal CVD process. In some instances, the fill material 136 may be formed of and include a non-reactive conductive material formed using a non-reactive PVD process, for example, in a non-reactive environment.

The fill material 136 may be formed of and include a non-conductive material (e.g., a dielectric material), such as an oxide (e.g., silicon dioxide ($SiO_2$)), a nitride (e.g., silicon nitride (SiN)), or an oxynitride. The fill material 136 may include a high quality silicon oxide material, such as an ALD $SiO_x$. For example, the fill material 136 may be a highly uniform and highly conformal silicon oxide material (e.g., a highly uniform and highly conformal silicon dioxide material) so that substantially no voids are present in the cell openings 128. In particular, the fill material 136 may be formulated to be formed in high aspect ratio (HAR) openings, such as those having a HAR of at least about 20:1, at least about 50:1, at least about 100:1, or at least about 1000:1, without forming voids. The fill material 136 may, alternatively, be formed of and include one or more of silicon oxycarbide ($SiO_xC_y$), silicon oxynitride ($SiO_xN_y$), hydrogenated silicon oxycarbide ($SiC_xO_yH_z$), and silicon oxycarbonitride ($SiO_xC_yN_z$). The fill material 136 may include a low-k dielectric material, such as a dielectric nitride material or a dielectric oxide material, having a dielectric constant (k) lower than the dielectric constant of a silicon nitride ($Si_3N_4$) material, of a silicon oxide ($SiO_x$, $SiO_2$) material, or of a carbon-doped silicon oxide material that includes silicon atoms, carbon atoms, oxygen atoms, and hydrogen atoms.

The fill material 136 may, alternatively, be formed of and include a conductive (e.g., metal) material. For example, the fill material 136 may be formed of and include a metal-containing material (e.g., a conductive metal nitride, a conductive metal silicide, a conductive metal carbide, a conductive metal oxide). In some embodiments, the fill material 136 includes titanium nitride. The fill material 136 may comprise a conductive material that is substantially devoid (e.g., substantially free) of tungsten. The fill material 136 may also be substantially devoid (e.g., substantially free) of halogens or halogen-containing compounds, such as from halogen-containing precursors (e.g., fluorine-containing precursors) used in the formation of tungsten. The fill material 136 may, for example, be free of halogen-containing compounds by forming the conductive structures from non-halogen-containing precursors. The fill material 136 may, alternatively, be formed from a so-called "low-halide" material that includes a minimal amount of halogen-containing precursors. In yet other embodiments, the fill material 136 may be formed of and include a semiconductor material, such as one or more of silicon germanium, germanium, and polycrystalline silicon (also known as "polysilicon"). For example, the fill material 136 may be n-doped polysilicon, p-doped polysilicon, or undoped polysilicon. The fill material 136 may also function as a barrier material, which material includes a material composition that is different than, and exhibits an etch selectivity with respect to, a material composition of the first conductive material 134. Accordingly, the fill material 136 may differ in chemical composition from the first conductive material 134, providing etch selectivity between the fill material 136 and the first conductive material 134.

The fill material 136 may be formed of and include a material composition that is tailored for reducing (e.g., minimizing) voids in the tiers 102 that may occur during formation of the conductive structures (see FIG. 1G) of the stack structure 101. Accordingly, the material composition of the fill material 136 may be selected for improved properties in forming (e.g., depositing, growing) such materials. The fill material 136 may include a material that is compatible (e.g., non-reactive) with the first conductive material 134. The fill material 136 may also be formulated to reduce migration (e.g., diffusion) of reactive species from surrounding conductive materials (e.g., the first conductive material 134). The fill material 136 may include a single material or, alternatively, multiple (e.g., two or more) materials having distinct boundaries therebetween. For example, formation of the fill material 136 may include forming a first portion (e.g., a liner) having a first material composition adjacent to (e.g., directly on) the first conductive material 134 followed by formation of a second portion having a second material composition adjacent to (e.g., directly on) the first portion.

With reference to FIG. 1F, portions of the fill material 136 may be selectively removed, such as by etching, to recess the fill material 136 from surfaces defining the slots 122. For example, the fill material 136 may be removed from within the end regions 128a of the cell openings 128 including the end regions 135a of the recessed portions 135 of the first conductive material 134. Portions of the fill material 136 may be selectively removed by exposing the fill material 136 to one or more wet etchants through the slots 122. For example, the end portions 136a (FIG. 1E) of the fill material 136 located proximate to the slots 122 may be substantially removed from the end regions 128a of the cell openings 128 without significantly removing portions of the first conductive material 134. Further, the central portions 136b of the fill material 136 may remain within the central regions 128b of the cell openings 128 in locations distal to the slots 122 and between the horizontally neighboring pillars 110. In other words, the end regions 128a of the cell openings 128 may be substantially devoid (e.g., substantially absent, substantially free) of the fill material 136, while the central regions 128b of the cell openings 128 may include remaining portions (e.g., the central portions 136b) of the fill material 136. Accordingly, the central portions 136b of the fill material 136 may be substantially surrounded by the first conductive material 134 in locations distal to the slots 122 and between the horizontally neighboring pillars 110, as shown in FIG. 1F.

With reference to FIG. 1G, a second conductive material 138 may be formed adjacent to (e.g., directly adjacent to) exposed surfaces of the first conductive material 134 within the end regions 128a (FIG. 1F) of the cell openings 128 (FIG. 1F) proximate to the slots 122 and within portions of the slots 122. The second conductive material 138 may substantially completely fill a remainder of the end regions 128a of the cell openings 128 including the end regions 135a (FIG. 1F) of the recessed portions 135 (FIG. 1F) of the first conductive material 134 so as to substantially fully extend between exposed upper and lower surfaces of the first conductive material 134. In other words, the second conductive material 138 may be formed to fill remaining portions of the end regions 128a of the cell openings 128 vacated upon removal of the sacrificial portions of the end portions 136a (FIG. 1E) of the fill material 136.

The second conductive material 138 may be formed of and include any conductive material including, but not limited to, n-doped polysilicon, p-doped polysilicon, undoped polysilicon, or a metal. In some embodiments, the second conductive material 138 is n-doped polysilicon. In other embodiments, the second conductive material 138 is tungsten. In additional embodiments, the second conductive material 138 is formed of and includes one or more of titanium, ruthenium, aluminum, and molybdenum. The first conductive material 134 and the second conductive material 138 may include substantially the same material composition with no easily discernable physical interface therebetween. Alternatively, the first conductive material 134 and the second conductive material 138 may include a material composition that differs from one another. Further, a material composition of the second conductive material 138 may differ from a material composition of the fill material 136 present between the horizontally neighboring pillars 110.

The second conductive material 138 may be formed using one or more conventional non-conformal deposition processes, such as one or more of a conventional PVD process (e.g., a conventional radio frequency PVD (RFPVD) process), or a conventional non-conformal CVD process. Further, a material composition of the second conductive material 138 may be formulated to exhibit less conformality relative to a material composition of one or more of the first conductive material 134 and the fill material 136.

As shown in FIG. 1G, formation of the second conductive material 138 results in formation of conductive structures 140 between vertically neighboring insulative structures 104 at locations corresponding to the previous locations of the additional insulative structures 106 (FIG. 1B). In turn, formation of the conductive structures 140 results in formation of tiers 142 of the insulative structures 104 and the conductive structures 140, and strings 144 of memory cells 146 vertically extending through the stack structure 101.

Portions of individual conductive structures 140 of the tiers 142 located distal to the slots 122 and between the horizontally neighboring pillars 110 include the fill material 136 within a central portion 141 (e.g., a vertically central portion) of the conductive structures 140. The fill material 136 may be substantially centered along a horizontal centerline of the conductive structures 140. In other words, a horizontal centerline of the fill material 136 may be substantially aligned with a horizontal centerline of the conductive structures 140 with substantially equal portions of the first conductive material 134 located above and below the fill material 136. However, the disclosure is not so limited, and additional configurations may be contemplated. For example, the horizontal centerline of the fill material 136 may be positioned above or, alternatively, below the horizontal centerline of the conductive structures 140 such that opposing portions of the first conductive material 134 include unequal thicknesses (e.g., heights) above and below the fill material 136 within the central portion 141 of the conductive structures 140.

The fill material 136 between the horizontally neighboring pillars 110 may be substantially surrounded by the first conductive material 134. For example, the fill material 136 may be adjacent to (e.g., directly adjacent to) the first conductive material 134 in one or more horizontal direction (e.g., the X-direction, the Y-direction) and in the vertical direction (e.g., the Z-direction). The first conductive material 134 of the conductive structures 140 vertically intervenes between the fill material 136 and the insulative structures 104. Further, the second conductive material 138 may be adjacent to (e.g., directly adjacent to) the first conductive material 134 within portions of the individual conductive structures 140 located proximate to the slots 122. Accordingly, the fill material 136 is laterally adjacent to the second conductive material 138 and separated therefrom by portions of the first conductive material 134 and the pillars 110. In other words, the fill material 136 is located at the same elevational level as the second conductive material 138 as a result of the second conductive material 138 being located within locations of the individual conductive structures 140 previously occupied by the sacrificial portions of the end portions 136a (FIG. 1E) of the fill material 136.

Formation of the second conductive material 138 following formation of the first conductive material 134 and the fill material 136, results in the conductive structures 140 being formed of and including one or more conductive materials that are tailored for reducing (e.g., minimizing) voids in the tiers 142 that may occur during formation of the conductive structures 140 within the stack structure 101. By forming the conductive structures 140 using two or more (e.g., three) separate process acts, the conductive structures 140 including the fill material 136 may result in reduced voids in the tiers 142 compared to conventional conductive structures formed by using a single process act (e.g., a single deposition act of a single conductive material).

In additional embodiments, such as in embodiments in which the fill material 136 is formed of and includes a differing conductive material than the first conductive material 134, the end portions 136a (FIG. 1E) of the fill material 136 may be present within the stack structure 101 without formation of the second conductive material 138 therein. In other words, the end portions 136a of the fill material 136 in combination with the first conductive material 134 may complete formation of the conductive structures 140. By forming the conductive structures 140 using two separate process acts, the conductive structures 140 including the fill material 136 may also result in reduced voids in the tiers 142 compared to conventional conductive structures formed by using a single process act (e.g., a single deposition act of a single conductive material).

With continued reference to FIG. 1G, the conductive structures 140 may function as word lines (e.g., local word lines) for the strings 144 of memory cells 146. In addition, the conductive structures 140 of one or more (e.g., from one to five) vertically lower tiers 142 (e.g., a vertically lowest tier 142) may be employed as select gate structures (e.g., select gate source (SGS) structures). Furthermore, conductive structures 140 of one or more (e.g., from one to five) vertically upper tiers 142 (e.g., a vertically highest tier 142) may be employed as select gate structures (e.g., select gate drain (SGD) structures).

Intersections of the conductive structures 140 and the pillars 110 may form individual memory cells 146 of the strings 144 of the memory cells 146. FIG. 1H illustrates an enlarged portion of box H of FIG. 1G and illustrates a memory cell 146, in accordance with embodiments of the disclosure. With reference to FIG. 1H, the memory cells 146 may each include the channel material 114, the tunnel dielectric material 116 horizontally neighboring the channel material 114, the memory material 118 horizontally neighboring the tunnel dielectric material 116, the dielectric blocking material 120, and the conductive structures 140 including the first conductive material 134 and the fill material 136 horizontally neighboring the dielectric blocking material 120. In further embodiments, the memory cells 146 comprise so-called "floating gate" memory cells including floating gates (e.g., metallic floating gates) as charge storage structures. The floating gates may horizontally intervene between central structures of the pillars 110 and the conductive structures 140 of the tiers 142 of the stack structure 101.

FIG. 1I illustrates a simplified partial top-down view of the electronic device 100 of FIG. 1G taken along a horizontal centerline of one of the conductive structures 140. Certain materials and structures (e.g., the dielectric barrier material 130, the conductive liner material 132) have been omitted in the top-down view of FIG. 1I for clarity. The pillars 110 may include a substantially round (e.g., substantially circular) horizontal cross-sectional area. Alternatively, the horizontal cross-sectional shape of the pillars 110 may have another shape (e.g., non-curved, non-round, non-circular). As best shown in the top-down view of FIG. 1I, the dielectric blocking material 120 is horizontally adjacent to the first conductive material 134 and the insulative structures 104 of the stack structure 101 (FIG. 1G), the memory material 118 is horizontally adjacent to the dielectric blocking material 120, and the tunnel dielectric material 116 is horizontally adjacent to the memory material 118. The channel material 114 may be horizontally adjacent to the tunnel dielectric material 116, and the insulative material 112 may be horizontally adjacent to and substantially surrounded by the channel material 114.

With reference to FIG. 1G in combination with FIG. 1I, the first conductive material 134 may substantially surround (e.g., substantially continuously surround) the dielectric blocking material 120 of the individual pillars 110 and the fill material 136 may be in direct physical contact with and substantially surround (e.g., substantially continuously surround) the first conductive material 134, as shown in FIG. 1I. Accordingly, the fill material 136 may substantially surround at least some of the pillars 110 in at least one horizontal direction (e.g., the X-direction, the Y-direction). For example, the pillars 110 within a central portion of the first block 124 and the second block 126 and distal to the slots 122 may be substantially surrounded by the fill material 136, while the pillars 110 that are most proximate (e.g., closest to) the slots 122 are partially surrounded by the fill material 136. In additional embodiments, such as in embodiments in which the fill material 136 includes a differing conductive material than the first conductive material 134, the end portions 136a of the fill material 136 may not be removed from the stack structure 101 and the pillars 110 proximate to the slots 122 may also be substantially surrounded by the fill material 136.

Figure 1J:
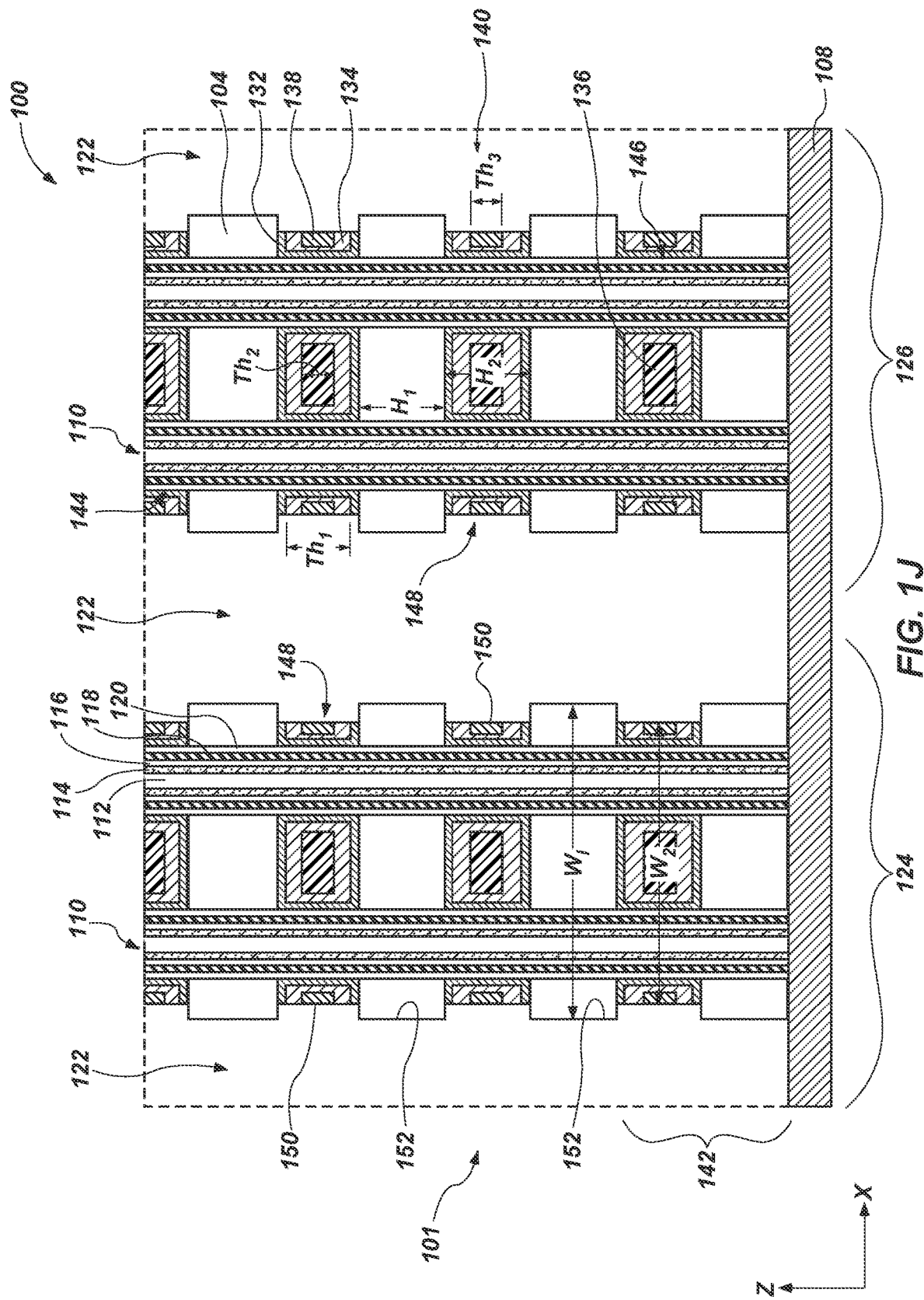

With reference to FIG. 1J, after forming the conductive structures 140, a portion of the conductive structures 140, the conductive liner material 132, and the dielectric barrier material 130, if present, may optionally be removed from surfaces defining the slots 122 to form recessed portions 148 of the conductive structures 140 and to electrically isolate neighboring conductive structures 140 from one another. In other words, removal of portions of the conductive materials (e.g., the first conductive material 134 and the second conductive material 138) of the conductive structures 140, the conductive liner material 132, and the dielectric barrier material 130 may physically and electrically isolate the conductive structures 140 from each other.

The conductive liner material 132 and the conductive materials of the conductive structures 140 may be removed by exposing the conductive liner material 132 and the conductive materials of the conductive structures 140 to one or more wet etchants through the slots 122. The wet etchants may include one or more of phosphoric acid, acetic acid, nitric acid, hydrochloric acid, aqua regia, or hydrogen peroxide. However, the disclosure is not so limited and the conductive liner material 132 and the conductive materials of the conductive structures 140 may be removed with other etchants and/or material removal processes (e.g., vapor phase removal processes, atomic layer removal processes). The conductive liner material 132 may, alternatively, be removed by exposure to one or more dry etchants, such as one or more chlorine-containing dry etchants. By way of non-limiting example, the one or more dry etchants may include one or more of chlorine gas, boron trichloride (BCL$_3$), oxygen, and argon. In some embodiments, the conductive liner material 132 is removed by exposure to a dry etchant comprising chlorine gas and boron trichloride.

Outermost portions of the insulative structures 104 may be removed during formation of the slots 122 or during subsequent material removal acts of the conductive structures 140 and the conductive liner material 132. Remaining amounts of the insulative structures 104 may have a width $W_1$ from opposite points of outer sidewalls 152 of the insulative structures 104. The conductive structures 140 and the conductive liner material 132 may be laterally recessed relative to the insulative structures 104, such that outer sidewalls 150 of the conductive structures 140 are nearer to a respective one of the pillars 110 than the outer sidewalls 152 of the insulative structures 104 are to the pillar 110. In other words, the width $W_1$ of the insulative structures 104 is greater than a width $W_2$ of the conductive structures 140, as shown in FIG. 1J. The conductive liner material 132 (if present) may, therefore, extend along only a portion of the width $W_1$ of a neighboring insulative structure 104.

A height $H_1$ of an individual insulative structure 104 may be substantially the same as a height $H_2$ of an individual conductive structure 140. Alternatively, the height $H_1$ of the insulative structures 104 may be greater than the height $H_2$ of the conductive structures 140. By way of non-limiting example, each of the height $H_1$ of the insulative structures 104 and the height $H_2$ of the conductive structures 140 may be within a range of from about 10 nanometers (nm) to about 50 nm, such as from about 10 nm to about 20 nm, from about 20 nm to about 30 nm, from about 30 nm to about 40 nm, or from about 40 nm to about 50 nm. If present, the conductive liner material 132 may have a thickness (e.g., a height) within a range of from about 0.5 nm to about 5 nm, and the dielectric barrier material 130, if present, may have a similar thickness as that of the conductive liner material 132.

The height $H_2$ of the conductive structures 140 may be defined by upper and lower surfaces of an outermost material (e.g., the conductive liner material 132 if present) directly adjacent to surfaces of vertically neighboring insulative structures 104. Thus, the height $H_2$ of the conductive structures 140 includes a combined thickness (e.g., height) of the first conductive material 134, as well as of one or more of the fill material 136, the second conductive material 138, the dielectric barrier material 130, and the conductive liner material 132. The height $H_2$ of the conductive structures 140 may be tailored based, at least in part, on individual thicknesses (e.g., heights) of the materials included therein, such as respective thicknesses of the first conductive material 134 and the fill material 136. A thickness $Th_1$ of the first conductive material 134 may be greater than each of a thickness $Th_2$ of the fill material 136 and a thickness $Th_3$ of the second conductive material 138. For example, the thickness $Th_2$ of the fill material 136 may be substantially the same as the thickness $Th_3$ of the second conductive material 138, each of which is less than the thickness $Th_1$ of the first conductive material 134, as shown in FIG. 1J. In other words, each of the thickness $Th_2$ of the fill material 136 and the thickness $Th_3$ of the second conductive material 138 is encompassed within the thickness $Th_1$ of the first conductive material 134.

By way of non-limiting example, the thickness $Th_1$ of the first conductive material 134 may be within a range of from about 10 nm to about 50 nm, such as from about 10 nm to about 20 nm, from about 20 nm to about 30 nm, from about 30 nm to about 40 nm, or from about 40 nm to about 50 nm, and each of the thickness $Th_2$ of the fill material 136 and the thickness $Th_3$ of the second conductive material 138 may individually be within a range of from about 2 nm to about 20 nm, such as from about 2 nm to about 5 nm, from about 5 nm to about 10 nm, from about 10 nm to about 15 nm, or from about 15 nm to about 20 nm. Further, thicknesses of each of an upper portion (e.g., an upper half) and a lower portion (e.g., a lower half) of the first conductive material 134 in vertical alignment with the fill material 136, for example, may individually be within a range of from about 2 nm to about 20 nm, such as from about 2 nm to about 5 nm, from about 5 nm to about 10 nm, from about 10 nm to about 15 nm, or from about 15 nm to about 20 nm.

The thickness $Th_1$ of the first conductive material 134 may exceed each of the thickness $Th_2$ of the fill material 136 and the thickness $Th_3$ of the second conductive material 138 by within a range of from about 8 nm to about 30 nm. For example, the thickness $Th_2$ of the fill material 136 may be within a range of from about 30 percent to about 70 percent of the thickness $Th_1$ of the first conductive material 134, such as about 50 percent. Thus, the combined thicknesses of the upper portion and the lower portion of the first conductive material 134 in vertical alignment with the fill material 136 may be substantially equal to the thickness $Th_2$ of the fill material 136. In other words, each of the first conductive material 134 and the fill material 136 may individually represent about one-half or, alternatively, less than one-half of the height $H_2$ of the conductive structures 140, irrespective of the thicknesses of the dielectric barrier material 130 and the conductive liner material 132, if present.

Figure 1K:
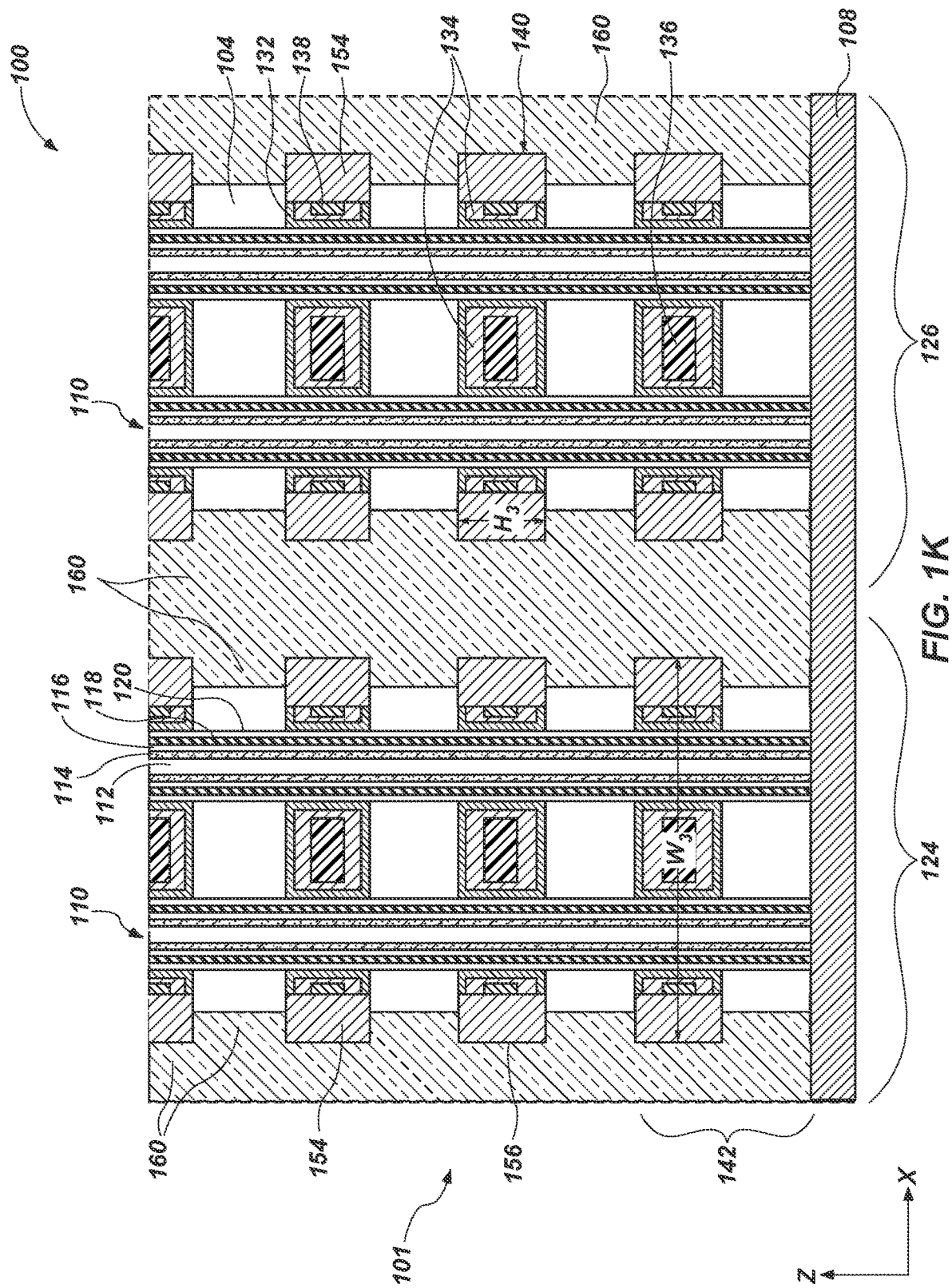

With reference to FIG. 1K, conductive rails 154 may optionally be formed horizontally adjacent to (e.g., on) at least the conductive structures 140 in a first horizontal direction (e.g., the X-direction) and having elongated portions extending in a second direction (e.g., the Y-direction). Since portions of the conductive structures 140 and the conductive liner material 132 are removed through the slots 122, the electrical resistance exhibited by the conductive structures 140 and the conductive liner material 132 of the tiers 142 of FIG. 1J may be greater than desired. To lower the electrical resistance, the conductive rails 154 may be formed to extend (e.g., laterally extend) from each exposed portion of the conductive structures 140 and, if present, the conductive liner material 132.

The conductive rails 154 may be formed of and include at least one conductive material. In some embodiments, the conductive rails 154 are formed of and include tungsten. The conductive rails 154 may or may not include substantially the same material composition as the conductive materials (e.g., the first conductive material 134, the fill material 136, the second conductive material 138) of the conductive structures 140. The conductive rails 154 may exhibit a lower resistivity than the conductive structures 140. As discussed above with reference to FIG. 1G, the conductive structures 140 may be formed of and include one or more conductive materials that are tailored for reducing (e.g., minimizing) voids in the tiers 142 that may occur during formation of the conductive structures 140 within the stack structure 101. Since resistivity of a structure may be based, at least in part, on a thickness (e.g., a height) of the material utilized, the conductive structures 140 may exhibit a lower resistivity than the conductive rails 154, in some instances, such as when a thickness of the conductive structures 140 is reduced upon a reduction in pitch of the tiers 142.

The conductive rails 154 may be formed using conventional processes. The conductive rails 154 may be formed (e.g., deposited, grown) adjacent to (e.g., on, directly on) the outer sidewalls 150 of the conductive structures 140 (and, if present, the conductive liner material 132) remaining after the material removal acts of FIG. 1J. In embodiments in which the conductive liner material 132 is present, the conductive rails 154 also extend laterally beyond sidewalls (e.g., side ends) of the conductive liner material 132.

In some embodiments, such as that of FIG. 1K, the conductive rails 154 are formed until each laterally extends beyond the outer sidewalls 152 of the insulative structures 104 without vertically overlapping the outer sidewalls 152. In other words, upper and lower surfaces of the conductive rails 154 may be substantially coplanar with upper and lower surfaces of the conductive structures 140 and/or the conductive liner material 132 without being adjacent to the outer sidewalls 152 (FIG. 1J) of the insulative structures 104. In other embodiments, the conductive rails 154 are formed until each laterally extends beyond and vertically overlaps the outer sidewalls 152 of the insulative structures 104, while still providing electrical isolation between neighboring blocks (e.g., the first block 124, the second block 126). Accordingly, the conductive rails 154 exhibit a height $H_3$ equal to or greater than the height $H_2$ of the conductive structures 140 of the stack structure 101.

With the conductive rails 154 extending laterally beyond the insulative structures 104, a maximum width $W_3$ defined by outer sidewalls 156 of the conductive rails 154 is greater than a maximum width $W_1$ defined by the outer sidewalls 152 of the insulative structures 104 and, thus, greater than a maximum width $W_2$ defined by the outer sidewalls 150 of the conductive structures 140. As used herein, the "outer" sidewalls 150, 152, 156 are the sidewalls proximate the sidewalls of a respective one of the blocks (e.g., the first block 124, the second block 126), opposite sidewalls proximate the pillars 110. Accordingly, the conductive rails 154 extend from the respective conductive structure 140, away from the pillars 110, such that the stack structure 101 includes conductive tiers of the tiers 142 including the conductive rails 154 that are laterally wider than the insulative structures 104. The width $W_2$ of the conductive structures 140 may be substantially similar to (e.g., substantially the same as) a width between outer side surfaces of outermost ones of the pillars 110. In other words, the conductive structures 140 may extend within regions of the stack structure 101 that are laterally bordered by the pillars 110, without extending beyond outermost pillars 110 on each lateral end of the blocks (e.g., the first block 124, the second block 126). Alternatively, at least a portion of the conductive structures 140 may intervene between the pillars 110 and the conductive rails 154, such that the pillars 110 are not in direct physical contact with the conductive rails 154.

By way of non-limiting example, the width $W_3$ of the conductive tiers may exceed the width $W_2$ of the conductive structures 140 by a range of from about 5 nm to about 100 nm, such as from about 5 nm to about 10 nm, from about 10 nm to about 20 nm, from about 20 nm to about 50 nm, or from about 50 nm to about 100 nm. Accordingly, each of the conductive rails 154 may have a horizontal width within a range of from about 5 nm to about 100 nm, such as from about 5 nm to about 10 nm, from about 10 nm to about 20 nm, from about 20 nm to about 50 nm, or from about 50 nm to about 100 nm. Further, the width $W_3$ of the conductive tiers may exceed the width $W_1$ of the insulative structures 104 by a range of from about 2 nm to about 50 nm, such as from about 2 nm to about 5 nm, from about 5 nm to about 10 nm, from about 10 nm to about 20 nm, or from about 20 nm to about 50 nm.

Individual conductive rails 154 are separated (e.g., spaced) from neighboring conductive rails 154 (e.g., the conductive rails 154 above and/or below) by a separation distance that is sufficient to electrically isolate each conductive rail 154 coupled to each conductive structure 140 of an individual tier 142 from each other conductive rail 154 coupled to each conductive structure 140 of another individual tier 142 vertically neighboring the individual tier 142. By way of non-limiting example, the distance between the neighboring pairs of the conductive rails 154 may be within a range of from about 2 nm to about 50 nm, such as from about 2 nm to about 5 nm, from about 5 nm to about 10 nm, from about 10 nm to about 20 nm, from about 20 nm to about 30 nm, from about 30 nm to about 40 nm, or from about 40 nm to about 50 nm.

As shown in FIG. 1K, the height $H_3$ of an individual conductive rail 154 is substantially the same as a height $H_2$ of an individual conductive structure 140. In other words, a lower surface of the conductive rail 154 may be substantially coplanar with a lower surface of the conductive structure 140, while an upper surface of the conductive rail 154 may be substantially coplanar with an upper surface of the conductive structure 140. In other embodiments, the height $H_3$ of the conductive rail 154 is relatively greater than the height $H_2$ of the conductive structure 140 (not illustrated). As used herein, the "non-rail remainder" of an individual tier 142 means that portion of the tier 142 that is outside of the boundaries of the conductive rails 154 coupled to the conductive structures 140 of the tier 142. The non-rail remainder of an individual tier 142 includes the conductive structure 140 and, if present, the conductive liner material 132. The upper and lower surfaces of the non-rail remainder of the individual tier 142 may be defined by the conductive structure 140, in the tiers 142 including only the conductive structures 140, or by the conductive liner material 132, in the tiers 142 including both the conductive structures 140 and the conductive liner material 132, as in the electronic device 100 of FIG. 1K, as well as in other embodiments of the disclosure.

By way of non-limiting example, the height $H_3$ of the conductive rails 154 may be within a range of from about 10 nm to about 100 nm, such as from about 10 nm to about 20 nm, from about 20 nm to about 30 nm, from about 30 nm to about 40 nm, from about 40 nm to about 50 nm, or from about 50 nm to about 100 nm. The height $H_2$ of an individual conductive rail 154 may, for example, be within a range of from about 1 percent to about 250 percent (e.g., from about 10 percent to about 250 percent, from about 25 percent to about 125 percent, from about 50 percent to about 100 percent) larger than the height $H_1$ of an individual conductive structure 140.

Following formation of the conductive rails 154, if present, remaining (e.g., unfilled) portions of the slots 122 (FIG. 1J) may be substantially filled with an additional fill material 160 (e.g., a dielectric material). The additional fill material 160 may extend through the stack structure 101 and be adjacent to (e.g., directly on) exposed upper surfaces of the source structure 108. In addition, the additional fill material 160 may be located between neighboring blocks (e.g., the first block 124 and the second block 126) at locations corresponding to the slots 122. Since the width $W_3$ of the conductive rails 154 is greater than the width $W_1$ (FIG. 1J) of the insulative structures 104, a lateral dimension (e.g., a width) of the additional fill material 160 laterally adjacent to the insulative structures 104 is greater than a lateral dimension of the additional fill material 160 laterally adjacent to the conductive rails 154. The additional fill material 160 may be formed of and include at least one insulative material (e.g., a dielectric material). The additional fill material 160 may have substantially the same material composition as the insulative structures 104.

As described above, forming the stack structure 101 of the electronic device 100 to include the conductive structures 140 using two or more (e.g., three) separate process acts may facilitate improved performance of the electronic device 100. For example, the presence of the fill material 136 within the central portion 141 of the conductive structures 140 effectively reduces the presence of voids in conductive materials present in the conductive tiers of the tiers 142, compared to conductive tiers lacking a fill material (e.g., a non-conductive material, a differing conductive material) within a central portion of individual conductive structures. Accordingly, the conductive structures may be formed without necessitating an increase in the horizontal footprint of the tiers 142 or the blocks (e.g., the first block 124, the second block 126). Further, the presence of the fill material 136 adjacent to the first conductive material 134 may provide a reduced resistivity (e.g., electrical resistance levels) of the conductive material in each respective tier 142. Thus, the electrical resistance exhibited by the conductive materials may be less than an electrical resistance of a conductive material of a conventional conductive tier of a 3D NAND structure. The lower electrical resistance may be achieved without necessitating an increase to the pitch or critical dimension (CD) of the pillars 110. Accordingly, reduced resistivity may be achieved, even while the pitch or CD of the pillars 110 continue to be scaled down to smaller values and while thicknesses (e.g., a height in the Z-direction) of the conductive tiers of the tiers 142 continue to be reduced.

Further, a material composition of the fill material 136 may be selected for improved properties (e.g., reduced resistivity) during use and operation of the electronic device 100. The reduced resistivity of the conductive materials of the tiers 142 may improve performance of the strings 144 of memory cells 146. In some instances, the fill material 136 may provide structural support to the conductive structures 140 and, thus, to the stack structure 101. In addition, the fill material 136 may be formulated to reduce migration (e.g., diffusion) of reactive species from the conductive material of the conductive structures 140. Since the fill material 136 may be formed within the central portions 141 of the conductive structures 140, the fill material 136 may limit capacitance (e.g., parasitic capacitance, stray capacitance) and increase shorts margin between vertically neighboring conductive structures 140 of the tiers 142 without significantly affecting resistance. Accordingly, the fill material 136 may be formulated to substantially reduce capacitance between vertically neighboring conductive structures 140, and may reduce cross-talk therebetween during use and operation of the electronic device 100. The reduced capacitance may, in turn, provide a reduced programming time, in some instances.

Electronic devices formed according to embodiments described herein may exhibit improved performance by providing reduced occurrences of voids during formation of the conductive materials of the conductive structures 140 within conductive tiers of the tiers 142. Further, reduced resistivity and, thus, increased conductivity may be achieved by providing additional conductive materials (e.g., the conductive rails 154) that extend beyond a boundary of the insulative structures 104 to provide an increased cross-sectional area of conductive material within the individual tiers 142. Additional performance improvements may be achieved by the conductive structures 140 comprising the fill material 136 within the central portion 141 thereof, which configuration may exhibit improved performance compared to conventional electronic devices. By way of comparison, fabrication of conventional electronic devices may include fabrication of conductive tiers by forming a single conductive material (e.g., in a single deposition act) and may not include a fill material (e.g., a non-conductive material, a differing conductive material) within a central portion of individual conductive structures.

Thus, in accordance with some embodiments of the disclosure, a method of forming an electronic device comprises forming a stack structure comprising vertically alternating insulative structures and additional insulative structures, and forming pillars comprising a channel material and at least one dielectric material vertically extending through the stack structure. The method comprises removing the additional insulative structures to form cell openings, forming a first conductive material within a portion of the cell openings, and forming a fill material adjacent to the first conductive material and within the cell openings. The fill material comprises sacrificial portions. The method comprises removing the sacrificial portions of the fill material, and forming a second conductive material within the cell openings in locations previously occupied by the sacrificial portions of the fill material.

Moreover, in accordance with further embodiments of the disclosure, an electronic device comprises a stack structure comprising tiers of alternating conductive structures and insulative structures, and pillars vertically extending through the stack structure, and a fill material within a central portion of individual conductive structures of the stack structure. The fill material is between neighboring pillars and is substantially surrounded by a conductive material of the individual conductive structures.

Figure 2:
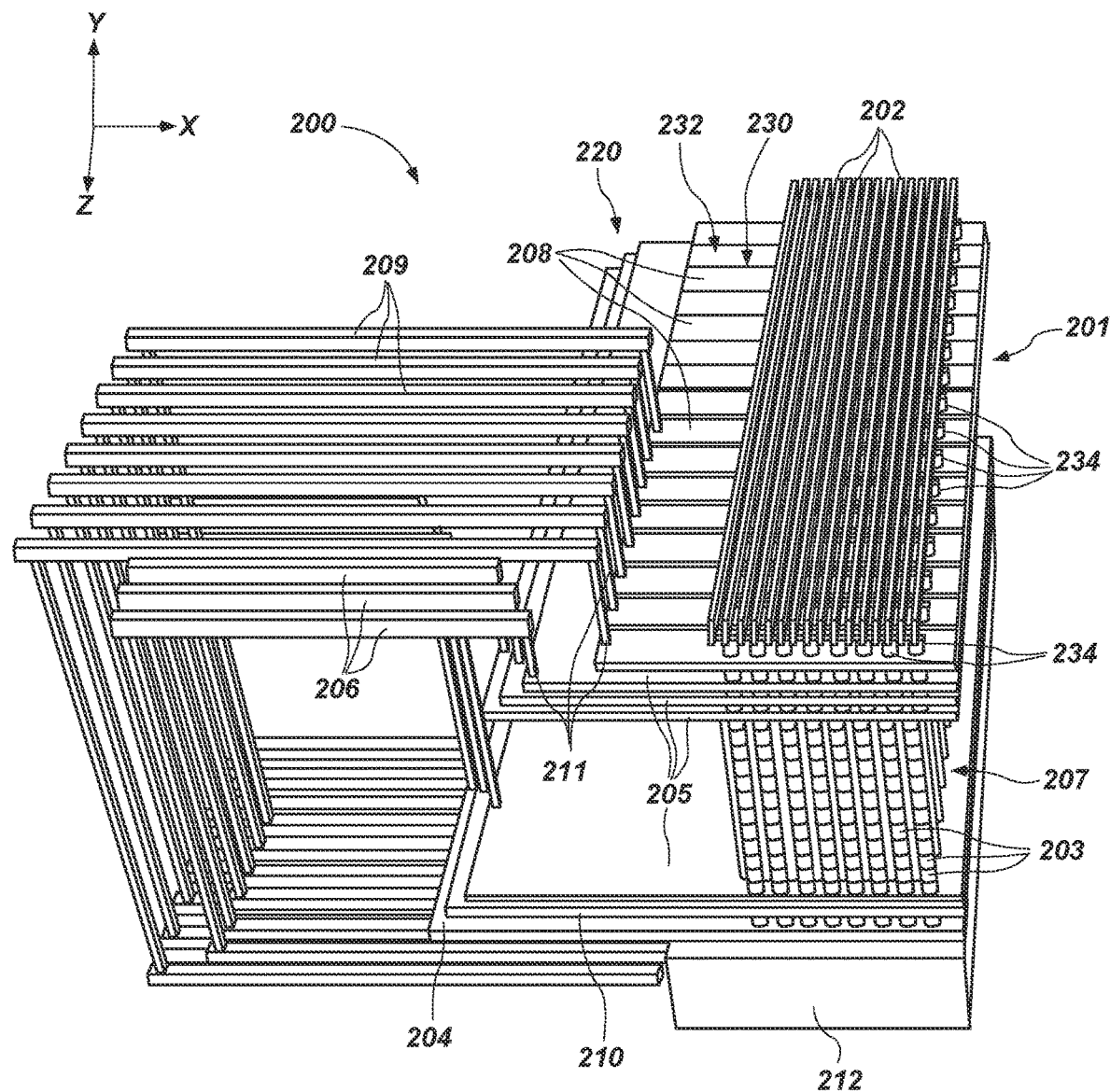
FIG. 2 is a partial cutaway perspective view of an electronic device, in accordance with embodiments of the disclosure.

FIG. 2 illustrates a partial cutaway perspective view of a portion of an electronic device 200 (e.g., a microelectronic device, a memory device, such as a 3D NAND Flash memory device) including one or more electronic device structures 201 (e.g., a microelectronic device structure). The electronic device 200 may be substantially similar to one of the electronic device 100 previously described with reference to FIG. 1A through FIG. 1K. As shown in FIG. 2, the electronic device structure 201 of the electronic device 200 may include a staircase structure 220 defining contact regions for connecting interconnect lines 206 to conductive structures 205 (e.g., corresponding to the conductive structures 140 (FIG. 1G)). The electronic device structure 201 may include vertical strings 207 (e.g., strings 144 (FIG. 1G)) of memory cells 203 (e.g., corresponding to the memory cells 146 (FIG. 1G)) that are coupled to each other in series. The vertical strings 207 may extend vertically (e.g., in the Z-direction) and orthogonally to conductive lines and the conductive structures 205, such as data lines 202, a source tier 204 (e.g., including the source structure 108 (FIG. 1G)), the interconnect lines 206, first select gates 208 (e.g., upper select gates, drain select gates (SGDs)), select lines 209, and a second select gate 210 (e.g., a lower select gate, a source select gate (SGS)). The select gates 208 may be horizontally divided (e.g., in the Y-direction) into multiple blocks 232 (e.g., blocks 124, 126 (FIG. 1G)) horizontally separated (e.g., in the Y-direction) from one another by slots 230 (e.g., the additional fill material 160 (FIG. 1K) formed within the slots 122 (FIG. 1J)).

Vertical conductive contacts 211 may electrically couple components to each other as shown. For example, the select lines 209 may be electrically coupled to the first select gates 208 and the interconnect lines 206 may be electrically coupled to the conductive structures 205. The electronic device 200 may also include a control unit 212 positioned under the memory array, which may include at least one of string driver circuitry, pass gates, circuitry for selecting gates, circuitry for selecting conductive lines (e.g., the data lines 202, the interconnect lines 206), circuitry for amplifying signals, and circuitry for sensing signals. The control unit 212 may be electrically coupled to the data lines 202, the source tier 204, the interconnect lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., digit lines, bit lines) may extend horizontally in a second direction (e.g., in the Y-direction) that is at an angle (e.g., perpendicular) to the first direction in which the first select gates 208 extend. Individual data lines 202 may be coupled to individual groups of the vertical strings 207 extending the second direction (e.g., the Y-direction) at the first end (e.g., the upper end) of the vertical strings 207 of the individual groups. Additional individual group of the vertical strings 207 extending the first direction (e.g., the X-direction) and coupled to individual first select gates 208 may share a particular vertical string 207 thereof with individual group of vertical strings 207 coupled to an individual data line 202. Thus, an individual vertical string 207 of memory cells 203 may be selected at an intersection of an individual first select gate 208 and an individual data line 202. Accordingly, the first select gates 208 may be used for selecting memory cells 203 of the vertical strings 207 of memory cells 203.

The conductive structures 205 (e.g., word line plates) may extend in respective horizontal planes. The conductive structures 205 may be stacked vertically, such that each conductive structure 205 is coupled to at least some of the vertical strings 207 of memory cells 203, and the vertical strings 207 of the memory cells 203 extend vertically through the stack structure including the conductive structures 205. The conductive structures 205 may be coupled to or may form control gates of the memory cells 203.

The first select gates 208 and the second select gates 210 may operate to select a vertical string 207 of the memory cells 203 interposed between data lines 202 and the source tier 204. Thus, an individual memory cell 203 may be selected and electrically coupled to a data line 202 by operation of (e.g., by selecting) the appropriate first select gate 208, second select gate 210, and conductive structure 205 that are coupled to the particular memory cell 203.

The staircase structure 220 may be configured to provide electrical connection between the interconnect lines 206 and the conductive structures 205 through the vertical conductive contacts 211. In other words, an individual conductive structure 205 may be selected via an interconnect line 206 in electrical communication with a respective vertical conductive contact 211 in electrical communication with the conductive structure 205.

The data lines 202 may be electrically coupled to the vertical strings 207 through conductive contact structures 234 (e.g., contact structures formed over the pillars 110 (FIG. 1A)).

Thus, in accordance with additional embodiments of the disclosure, a memory device comprises a stack structure comprising alternating conductive structures and insulative structures arranged in tiers. Each tier individually comprises a conductive structure and an insulative structure. The memory device comprises a barrier material separating opposing portions of a conductive material of the conductive structures, and strings of memory cells vertically extending through the stack structure. The strings of memory cells comprising a channel material vertically extending through the stack structure. The memory device comprises conductive rails laterally adjacent to the conductive structures of the stack structure. Individual conductive rails are in horizontal alignment with the barrier material and the conductive material of a respective conductive structure.

Figure 3:
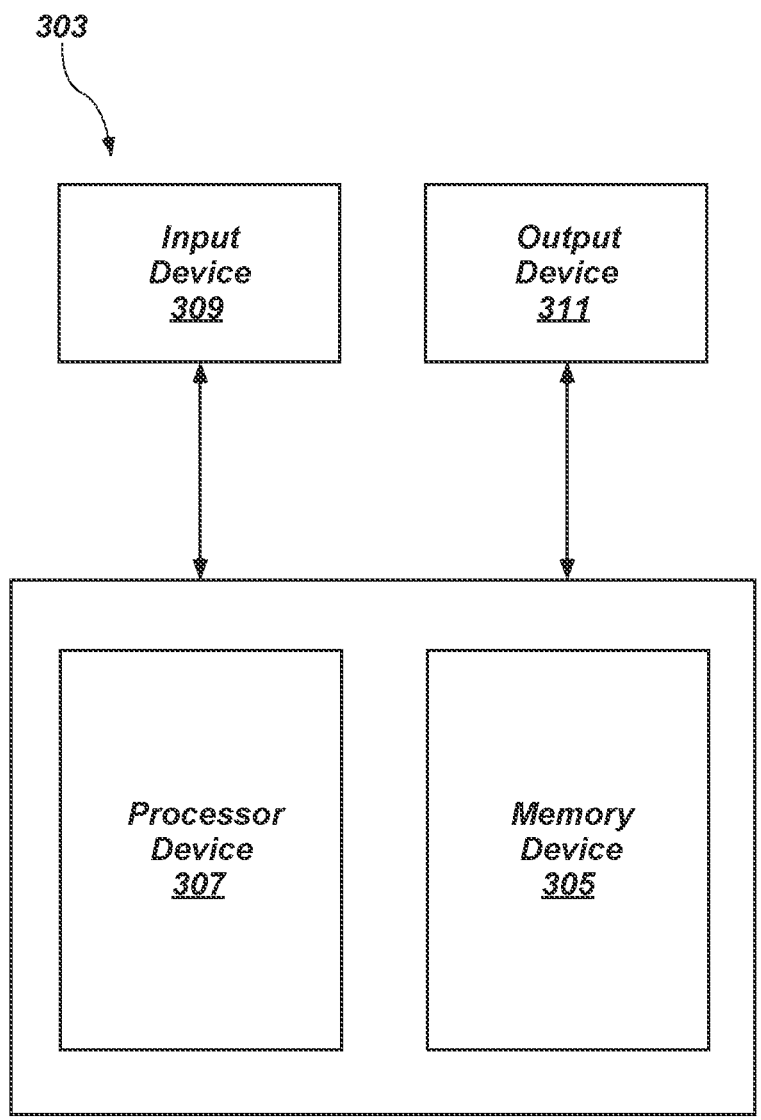
FIG. 3 is a block diagram of an electronic system, in accordance with embodiments of the disclosure.

Electronic devices including electronic devices (e.g., the electronic devices 100, 200) including the fill material 136 within the central portion 141 of individual conductive structures 140, according to embodiments of the disclosure, may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of an electronic device previously described herein (e.g., the electronic devices 100, 200 previously described with reference to FIG. 1A through FIG. 1K and FIG. 2) including the fill material 136 within the central portion 141 of individual conductive structures 140.

The electronic system 303 may further include at least one electronic signal processor device 307 (often referred to as a "microprocessor"). The electronic signal processor device 307 may optionally include an embodiment of an electronic device previously described herein (e.g., one or more of the electronic devices 100, 200 previously described with reference to FIG. 1A through FIG. 1K and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
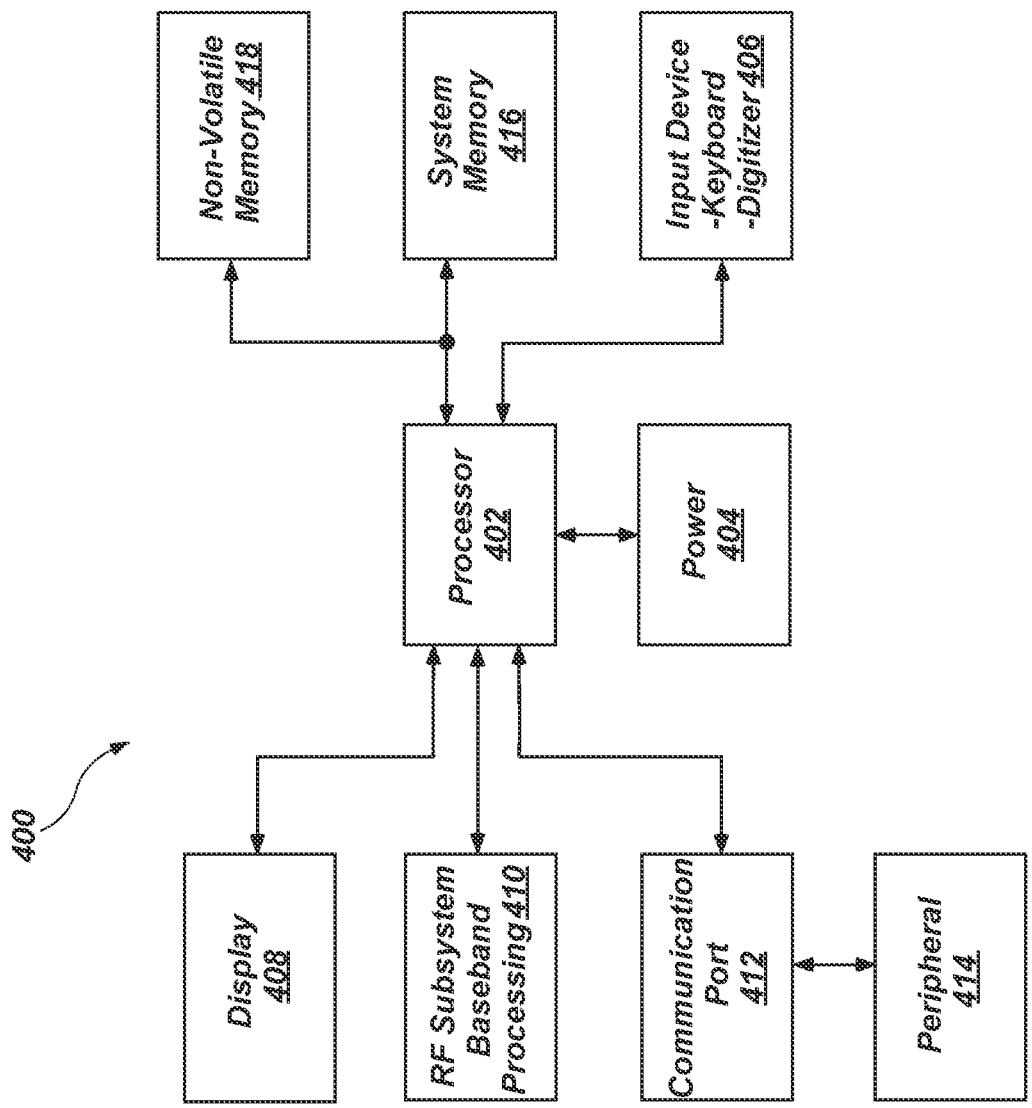
FIG. 4 is a block diagram of a processor-based system, in accordance with embodiments of the disclosure.

With reference to FIG. 4, depicted is a processor-based system 400. The processor-based system 400 may include various electronic devices (e.g., electronic devices including one or more of the electronic devices 100, 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include electronic devices (e.g., electronic devices including one or more of the electronic devices 100, 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the electronic devices (e.g., the electronic devices 100, 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include electronic devices, such as the electronic devices (e.g., the electronic devices 100, 200) described above, or a combination thereof.

Accordingly, in at least some embodiments, a system comprises a processor operably coupled to an input device and an output device, and an electronic device operably coupled to the processor. The electronic device comprises strings of memory cells vertically extending through a stack structure comprising vertically alternating sequences of insulative structures and conductive structures arranged in tiers, and a fill material circumferentially surrounding at least some of the strings of memory cells. The fill material is between opposing portions of a conductive material within individual conductive structures.

The electronic devices and systems of the disclosure advantageously facilitate one or more of improved simplicity, greater packaging density, and increased miniaturization of components as compared to conventional devices and conventional systems. The methods of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional microelectronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of forming an electronic device, the method comprising:
   forming a stack structure comprising vertically alternating insulative structures and additional insulative structures;
   forming pillars comprising a channel material and at least one dielectric material vertically extending through the stack structure;
   removing the additional insulative structures to form cell openings;
   forming a metal nitride material within the cell openings and adjacent to the insulative structures of the stack structure forming a first conductive material selected from the group consisting of one or more of tungsten, titanium, ruthenium, aluminum, and molybdenum within a portion of the cell openings, the first conductive material directly adjacent to and substantially surrounded by the metal nitride material;
   forming a fill material directly adjacent to the first conductive material and within the cell openings, the fill material comprising sacrificial portions;
   removing the sacrificial portions of the fill material; and
   forming a second conductive material within the cell openings in locations previously occupied by the sacrificial portions of the fill material to form tiers of alternating conductive structures and the insulative structures of the stack structure, the fill material within a central portion of individual conductive structures of the stack structure, and the fill material between horizontally neighboring pillars and substantially surrounded by the first conductive material of the individual conductive structures.

2. The method of claim 1, further comprising forming slots within the stack structure prior to removing the additional insulative structures, wherein removing the sacrificial portions of the fill material comprises selectively removing the sacrificial portions of the fill material proximate to the slots without removing the fill material distal to the slots and between the horizontally neighboring pillars.

3. The method of claim 2, wherein forming the second conductive material comprises substantially completely filling remaining portions of the cell openings proximate to the slots with the second conductive material without forming the second conductive material between the horizontally neighboring pillars.

4. The method of claim 1, wherein:
   forming the first conductive material comprises conformally forming the first conductive material without fully filling the cell openings; and
   forming the second conductive material comprises non-conformally forming the second conductive material using one or more of chemical vapor deposition and physical vapor deposition.

5. The method of claim 1, wherein forming the fill material directly adjacent to the first conductive material and within the cell openings comprises selecting the fill material to be selectively etchable relative to the first conductive material.

6. The method of claim 1, wherein forming the fill material comprises conformally forming one or more of a polysilicon material and a dielectric material directly adjacent to the first conductive material.

7. The method of claim 1, wherein forming the first conductive material within the portion of the cell openings and forming the second conductive material within the cell openings comprises selecting each of the first conductive material and the second conductive material to comprise tungsten and selecting the fill material to comprise a different conductive material.

8. The method of claim 1, further comprising laterally recessing each of the first conductive material and the second conductive material relative to the insulative structures and forming conductive rails directly laterally adjacent to the first conductive material and the second conductive material.

9. An electronic device, comprising:
   a stack structure comprising tiers of alternating conductive structures and insulative structures;
   pillars vertically extending through the stack structure;
   a metal nitride material adjacent to the insulative structures of the stack structure;
   one or more conductive materials selected from the group consisting of tungsten, titanium, ruthenium, aluminum, and molybdenum substantially surrounded by the metal nitride material; and
   a fill material within a central portion of individual conductive structures of the stack structure, the fill material between neighboring pillars and substantially surrounded by the one or more conductive materials of the individual conductive structures, the one or more conductive materials directly between the metal nitride material and the fill material.

10. The electronic device of claim 9, further comprising an additional conductive material within a central portion of the individual conductive structures of the stack structure at an elevational level of the fill material, the additional conductive material external to a region of the stack structure including the pillars.

11. The electronic device of claim 10, wherein a chemical composition of the additional conductive material of the individual conductive structures differs from a chemical composition of the one or more conductive materials of the individual conductive structures.

12. The electronic device of claim 10, wherein the one or more conductive materials of the individual conductive structures substantially surround the additional conductive material on three sides, the one or more conductive materials directly between the metal nitride material and the additional conductive material.

13. The electronic device of claim 9, further comprising a high-k dielectric material directly between the metal nitride material and the insulative structures of the stack structure.

14. The electronic device of claim 9, wherein the fill material substantially surrounds at least some of the pillars in at least one horizontal direction.

15. The electronic device of claim 9, wherein the fill material comprises a material that is non-reactive with the one or more conductive materials of the individual conductive structures.

16. The electronic device of claim 9, wherein the fill material comprises one or more of an oxide material, a nitride material, and a carbide material within a vertically central portion of the individual conductive structures.

17. The electronic device of claim 9, wherein the one or more conductive materials of the individual conductive structures include upper portions and lower portions separated from one another by the fill material, a combined thickness of the upper portions and the lower portions of the one or more conductive materials being substantially equal to a thickness of the fill material.

18. The electronic device of claim 9, wherein:
the one or more conductive materials of the individual conductive structures extend between the neighboring pillars and laterally beyond outermost pillars; and
the fill material extends between the neighboring pillars, without extending laterally beyond the outermost pillars.

19. The electronic device of claim 9, wherein the metal nitride material comprises a single material comprising titanium nitride, the one or more conductive materials vertically intervening between the fill material and the metal nitride material.

20. The electronic device of claim 9, further comprising conductive rails directly between the one or more conductive materials of the individual conductive structures and a dielectric material between adjacent blocks of the stack structure, individual conductive rails in horizontal alignment with the fill material and laterally separated therefrom by at least one of the pillars.

21. An electronic device, comprising:
a stack structure comprising tiers of alternating conductive structures and insulative structures;
pillars vertically extending through the stack structure;
a fill material separating vertically opposing portions of a conductive material of the conductive structures; and
conductive rails directly abutting side surfaces of the conductive structures of the stack structure, the conductive rails extending laterally beyond outer side surfaces of the insulative structures of the stack structure.

22. The electronic device of claim 21, further comprising dielectric-filled slots separating the stack structure into blocks, the conductive structures and the conductive rails separating the fill material from the dielectric-filled slots.

23. The electronic device of claim 21, further comprising an additional conductive material directly between the conductive rails and the conductive material of the conductive structures of the stack structure, upper and lower surfaces of the additional conductive material substantially coplanar with upper and lower surfaces of the fill material.

24. The electronic device of claim 21, wherein a chemical composition of the conductive rails differs from a chemical composition of the conductive material of the conductive structures of the stack structure.

25. The electronic device of claim 21, wherein the conductive rails comprise tungsten and the conductive material of the conductive structures of the stack structure are substantially devoid of tungsten.

* * * * *